United States Patent
Tanaka et al.

(10) Patent No.: US 6,360,814 B1
(45) Date of Patent: Mar. 26, 2002

(54) COOLING DEVICE BOILING AND CONDENSING REFRIGERANT

(75) Inventors: Hiroshi Tanaka; Tadayoshi Terao, both of Toyoake; Eitaro Tanaka, Kariya; Takahide Ohara, Okazaki; Kiyoshi Kawaguchi, Kariya, all of (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 09/638,631

(22) Filed: Aug. 14, 2000

(30) Foreign Application Priority Data

| Aug. 31, 1999 | (JP) | .......................... 11-244460 |
| Sep. 1, 1999 | (JP) | .......................... 11-247912 |
| Sep. 7, 1999 | (JP) | .......................... 11-252929 |

(51) Int. Cl.⁷ .................. F28D 15/00; H01L 23/24; H05K 7/20
(52) U.S. Cl. .................. 165/104.33; 165/104.21; 257/715; 361/699; 361/700
(58) Field of Search .................. 165/80.3, 80.4, 165/104.21, 104.33; 361/699, 700; 257/715

(56) References Cited

U.S. PATENT DOCUMENTS

| 5,159,972 A | * | 11/1992 | Gunnerson et al. .... 165/104.21 |
| 5,924,481 A | * | 7/1999 | Tajima ................... 165/104.33 |
| 5,998,863 A | * | 12/1999 | Kobayashi et al. ......... 257/715 |
| 6,005,772 A | * | 12/1999 | Terao et al. ........... 165/104.33 |
| 6,076,596 A | * | 6/2000 | Osakable et al. ....... 165/104.33 |
| 6,102,110 A | * | 8/2000 | Julien et al. ........... 165/104.33 |

* cited by examiner

Primary Examiner—Ira S. Lazarus
Assistant Examiner—Tho V Duong
(74) Attorney, Agent, or Firm—Harness, Dickey & Pierce, PLC

(57) ABSTRACT

A cooling device for cooling a heat-generating member includes a refrigerant tank for boiling liquid refrigerant by heat from the heat-generating member and a radiator for cooling and condensing gas refrigerant from the refrigerant tank. The refrigerant tank has therein a plurality of refrigerant passages defined by ribs which are integrally formed with any one of opposite wall parts of the refrigerant tank. The ribs continuously extend in an up-down direction to be slightly longer than an up-down dimension of a boiling surface of the refrigerant tank. In the cooling device, because each passage width of the refrigerant passages is set to be equal to or smaller than double Laplace length, an outer diameter of bubbles in the refrigerant passages becomes larger, and liquid refrigerant can be moved upwardly by bubbles. Accordingly, it can restrict liquid refrigerant surface from being lowered even when gas-generating amount is increased.

15 Claims, 21 Drawing Sheets

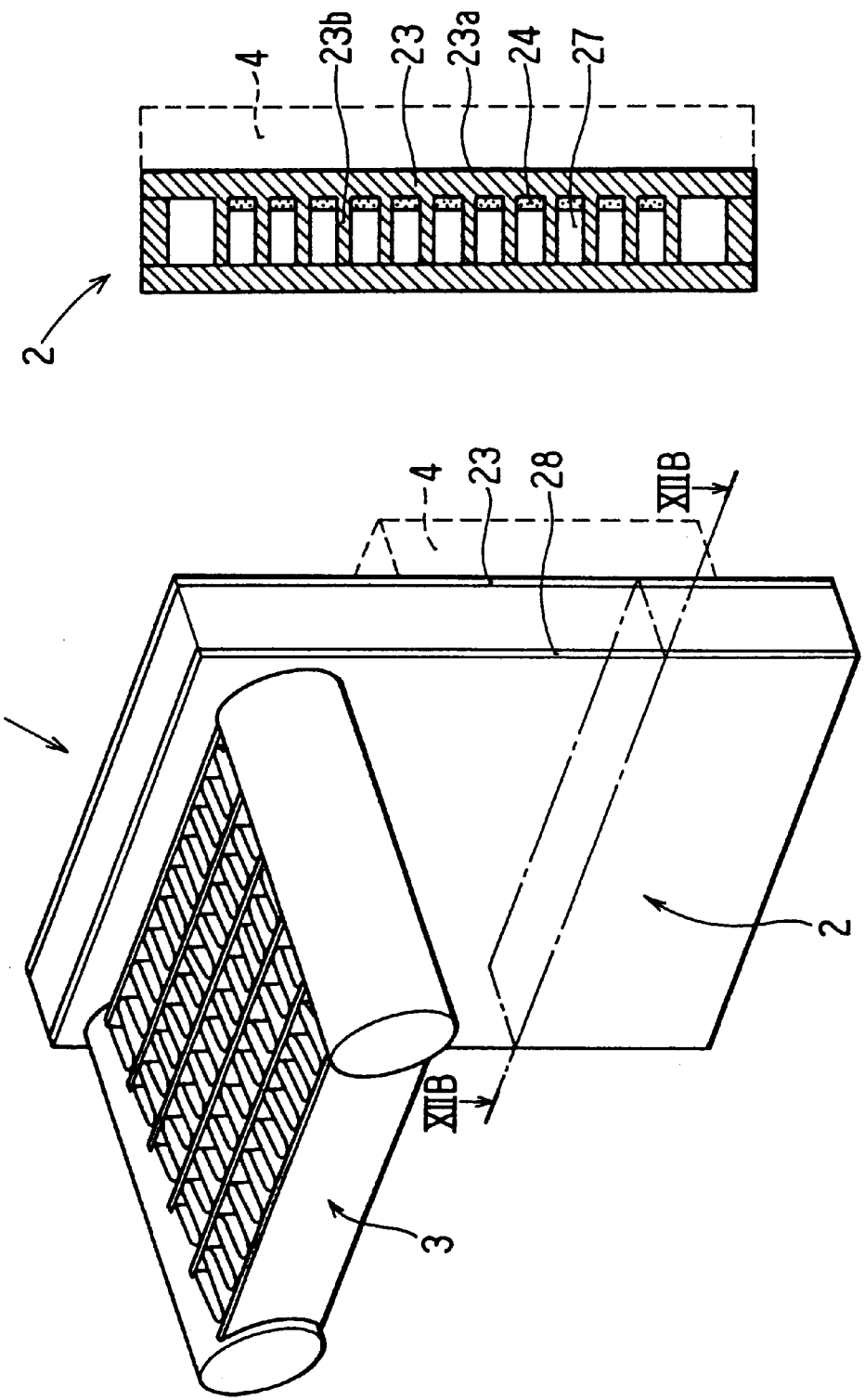

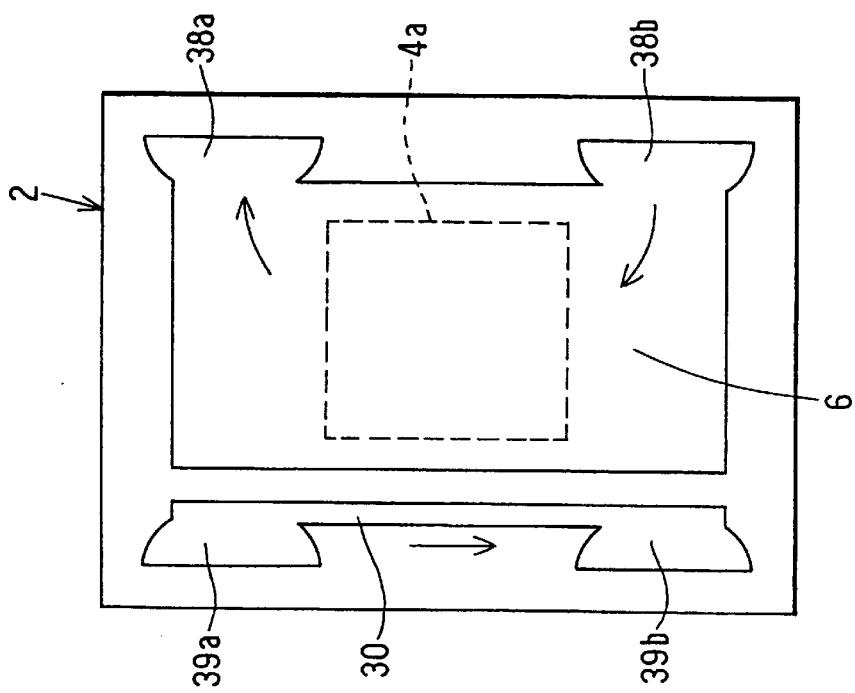
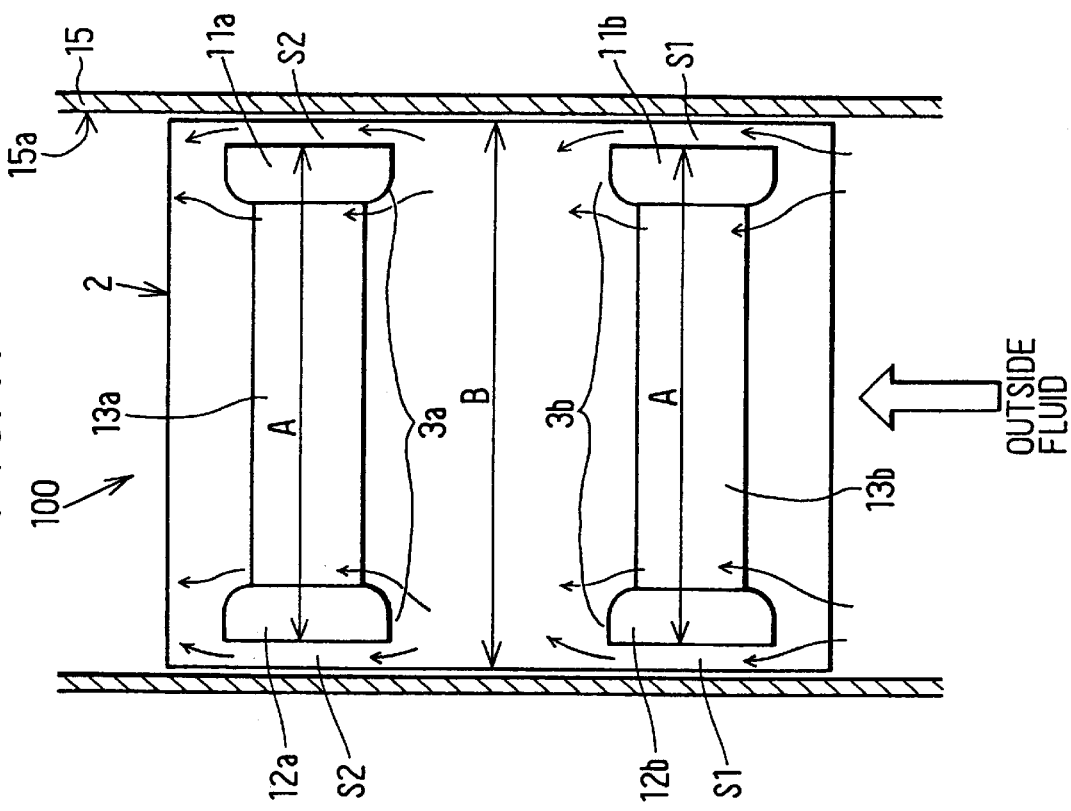

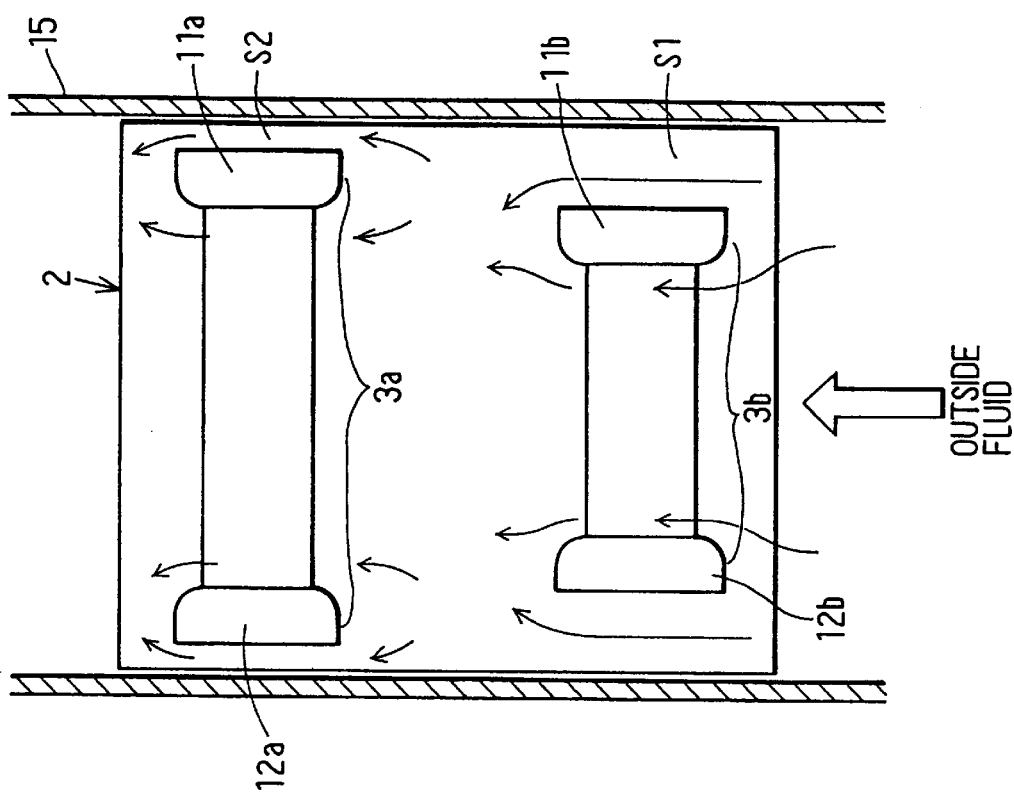
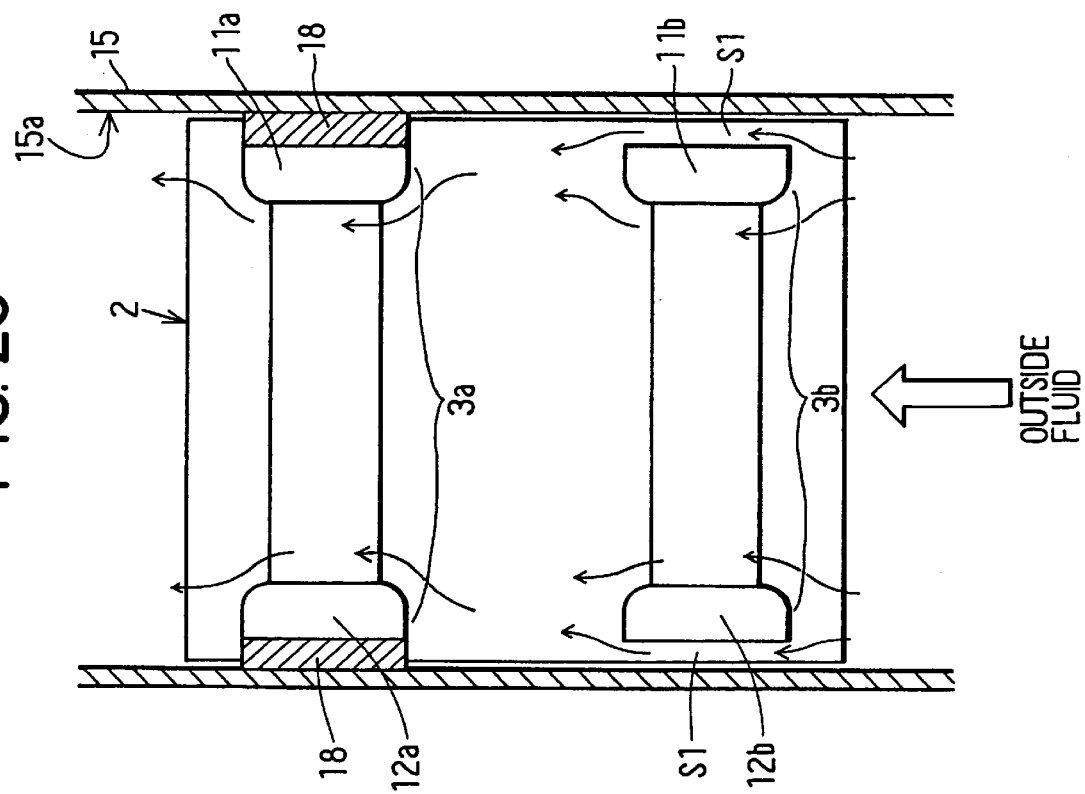

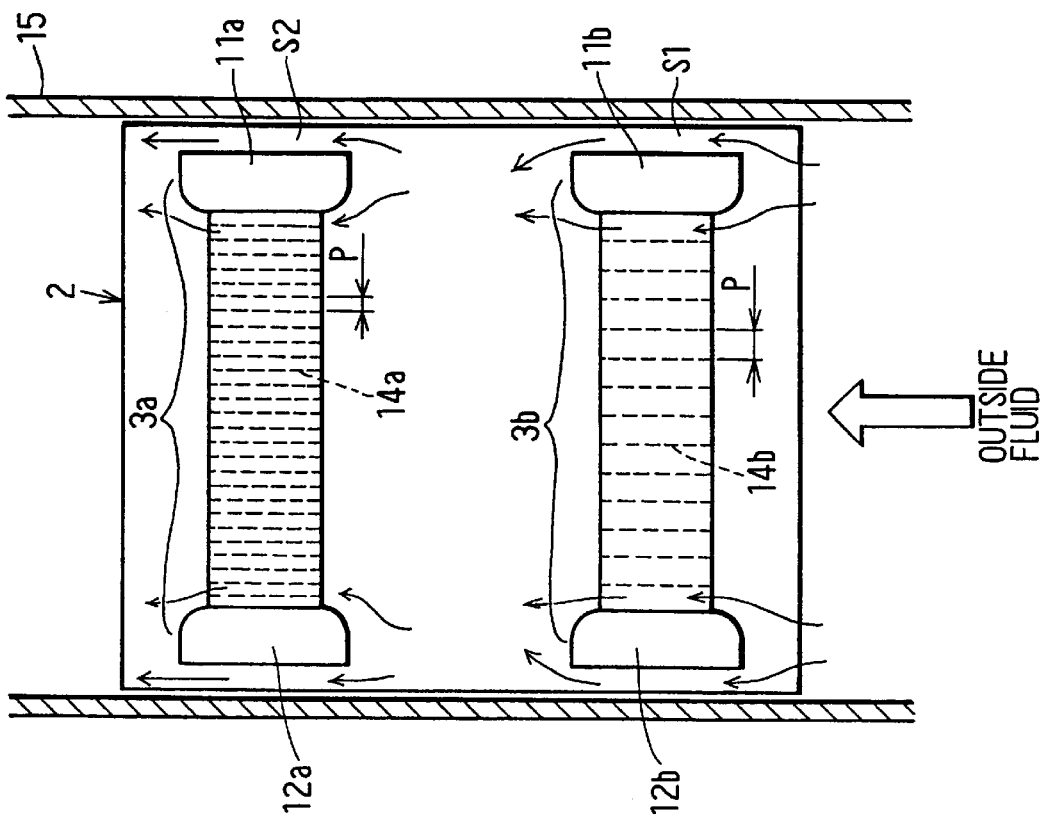
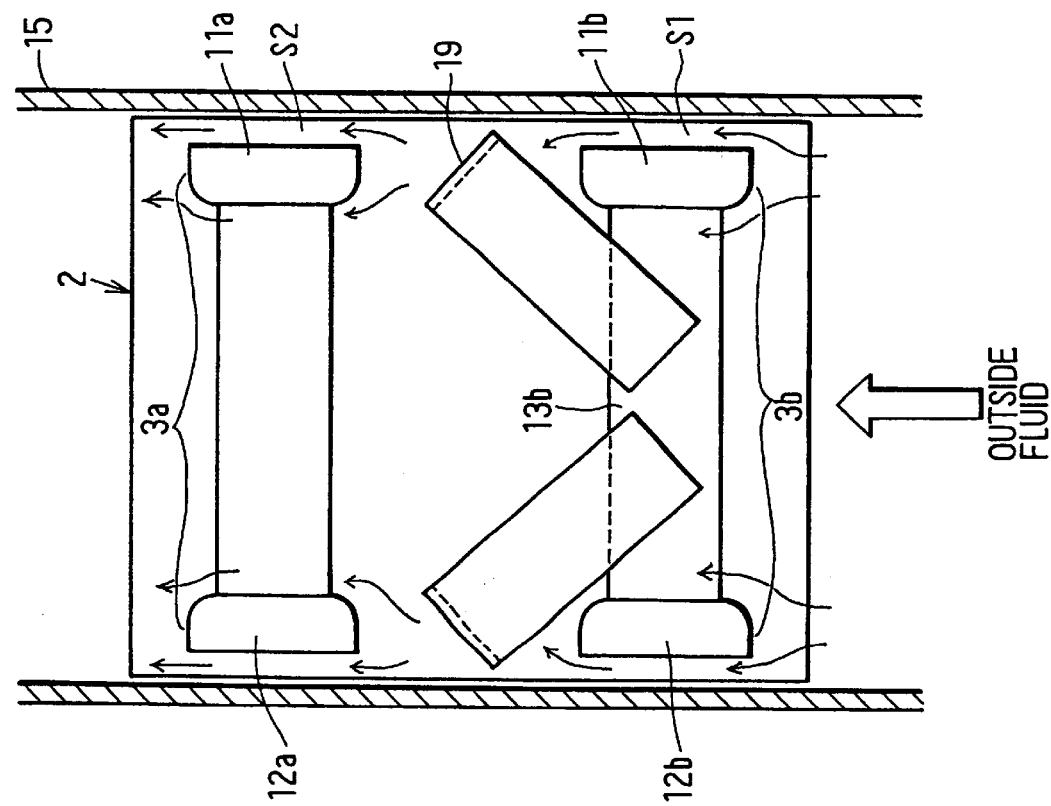

COOLING DEVICE BOILING AND CONDENSING REFRIGERANT

CROSS-REFERENCE TO RELATED APPLICATION

This application is related to and claims priority from Japanese Patent Applications No. Hei. 11-244460 filed on Aug. 31, 199, No. Hei. 11-247912 filed on Sep. 1, 1999 and No. Hei. 11-252929 filed on Sep. 7, 1999, the contents of which are hereby incorporated by reference.

BACKGROUND OF THE INVENTION

1. Field of the Invention

The present invention relates to a cooling device for cooling a heat-generating member by boiling and condensing refrigerant.

2. Description of Related Art

In a conventional cooling device for cooling a heat-generating member such as an electronic component, refrigerant in a refrigerant tank is boiled by heat from the heat-generating member, and gas refrigerant from the refrigerant tank is condensed in a radiator. For reducing a sealed amount of expensive refrigerant, the refrigerant tank is formed to be thinned. However, when an evaporated amount of refrigerant within the refrigerant tank increases, i.e., when a heat-generating density becomes larger, a temperature of a boiling surface of the refrigerant tank rapidly increases so that liquid refrigerant may be dried out.

On the other hand, in a cooling device boiling and condensing refrigerant described in JP-A-10-209355, JP-A-10-209356 or JP-A-11-87583, a heat-generating member (e.g., CPU) is fixed to a heat-receiving wall of a flat-box type refrigerant tank in which a predetermined amount refrigerant is sealed, and a radiator fin is attached to a heat-radiating wall of the refrigerant tank, opposite to the heat-receiving wall. In the cooling device, heat generated from the heat-generating member is transmitted to refrigerant within the refrigerant tank through the heat-receiving wall so that refrigerant is evaporated, and the evaporated gas refrigerant is cooled and condensed in the heat-radiating wall so that condensation latent heat of refrigerant is transmitted to an outside fluid through the heat-radiating wall. However, in this case, when pressure of the sealed refrigerant becomes higher and a distortion is caused due to the pressure in the refrigerant tank, the heat-generating member does not sufficiently contact the refrigerant tank. Therefore, heat-transmitting performance between the heat-generating member and the heat-receiving wall of the refrigerant tank becomes insufficient, and the heat-generating member is not sufficiently cooled.

SUMMARY OF THE INVENTION

In view of the foregoing problems, it is an object of the present invention to provide a cooling device boiling and condensing refrigerant, which prevents refrigerant from being dried out on a boiling surface of a refrigerant tank even when a gas-refrigerant generating amount becomes larger.

It is an another object of the present invention to provide a cooling device boiling and condensing refrigerant, which improves heat-transmitting performance from a wall part of a refrigerant tank to refrigerant, with a simple structure.

It is a further another object of the present invention to provide a cooling device having first and second radiator portions, which improves heat-radiating capacity in a downstream radiator portion among the first and second radiator portions, disposed at a downstream side relative to a flow direction of outside fluid.

According to a first aspect of the present invention, a cooling device boiling and condensing refrigerant includes a refrigerant tank for defining a refrigerant chamber in which liquid refrigerant is stored and a part of liquid refrigerant is boiled and vaporized by absorbing heat from a heat-generating member attached onto one side wall part of the refrigerant tank, and a radiator disposed on the other side wall part of the refrigerant tank to perform a heat exchange between gas refrigerant from the refrigerant tank and outside fluid passing through the radiator. The refrigerant tank has therein a plurality of refrigerant passages continuously extending in an up-down direction at least in a range of a boiling surface of the refrigerant tank, and each passage width of the refrigerant passages is set to be equal to or smaller than double Laplace length. Thus, bubble dimension of gas refrigerant boiled in the refrigerant chamber by heat from the heat-generating member becomes larger than a passage width of the refrigerant passages; and therefore, liquid refrigerant rises in the refrigerant chamber when bubbles of gas refrigerant move upwardly in the refrigerant passages. Accordingly, even when gas-generating amount is increased, liquid refrigerant can be supplied to the boiling surface of the refrigerant chamber while it can restrict liquid refrigerant surface from being lowered.

According to a second aspect of the present invention, a porous layer made of a material having a sufficient heat conductivity is disposed on an inner surface of the one side wall part, defining the refrigerant chamber, at least in a part of the inner surface opposite to the heat-generating member. Therefore, a contact area of the refrigerant tank with refrigerant is increased by the porous layer, and refrigerant is readily evaporated by the porous layer. That is, heat-transmitting performance from the one side wall part to refrigerant is improved by the porous layer. Thus, refrigerant can be effectively evaporated in a wide range of the refrigerant tank, and super-heating degree of refrigerant around a position where the heat-generating member is disposed can be reduced.

According to a third aspect of the present invention, the radiator includes a first radiator portion for performing heat exchange between gas refrigerant from the refrigerant tank and outside fluid passing through the first radiator portion, and a second radiator portion for performing heat exchange between refrigerant from the first radiator portion and outside fluid passing through the second radiator portion. The second radiator portion is disposed at a lower side of the first radiator portion in an up-down direction. A duct extending in the up-down direction is disposed to enclose both the first radiator portion and the second radiator portion, to define an outside fluid passage through which outside fluid passes through both the first radiator portion and the second radiator portion in the up-down direction. One upstream radiator portion among the first radiator portion and the second radiator portion, disposed at an upstream side relative to a flow direction of outside fluid, is disposed to be separated from an inner surface of the duct so that a clearance through which outside fluid bypasses the upstream radiator portion is defined between the inner surface of the duct and the upstream radiator portion. Thus, low-temperature outside fluid passing through the clearance can be supplied to the other downstream radiator portion among the first and second radiator portions, disposed at a downstream side relative to the flow direction of outside fluid. As a result, heat-radiating capacity of the downstream radiator portion can be improved.

BRIEF DESCRIPTION OF THE DRAWINGS

Additional objects and advantages of the present invention will be more readily apparent from the following detailed description of preferred embodiments when taken together with the accompanying drawings, in which:

FIG. 12A is a perspective view showing a cooling device according to a fifth preferred embodiment of the present invention, and FIG. 12B is a cross-sectional view taken along line XIIB—XIIB in FIG. 12A, showing a refrigerant tank of the cooling device;

FIG. 17 is a front view of the cooling device when being viewed from a radiator side according to the sixth embodiment;

FIG. 18 is a schematic view for explaining an inner structure of a refrigerant tank according to the sixth embodiment;

FIG. 20 is a front view of a cooling device when being viewed from a radiator side according to a seventh preferred embodiment of the present invention;

FIG. 20 is a front view of a cooling device when being viewed from a radiator side according to a seventh preferred embodiment of the present invention;

FIG. 21 is a front view of a cooling device when being viewed from a radiator side according to an eighth preferred embodiment of the present invention;

FIG. 24 is a front view of a cooling device when being viewed from a radiator side according to a tenth preferred embodiment of the present invention;

FIG. 25 is a front view of a cooling device when being viewed from a radiator side according to an eleventh preferred embodiment of the present invention;

DETAILED DESCRIPTION OF THE PRESENTLY PREFERRED EMBODIMENTS

Preferred embodiments of the present invention will be described hereinafter with reference to the accompanying drawings.

Figure 1:
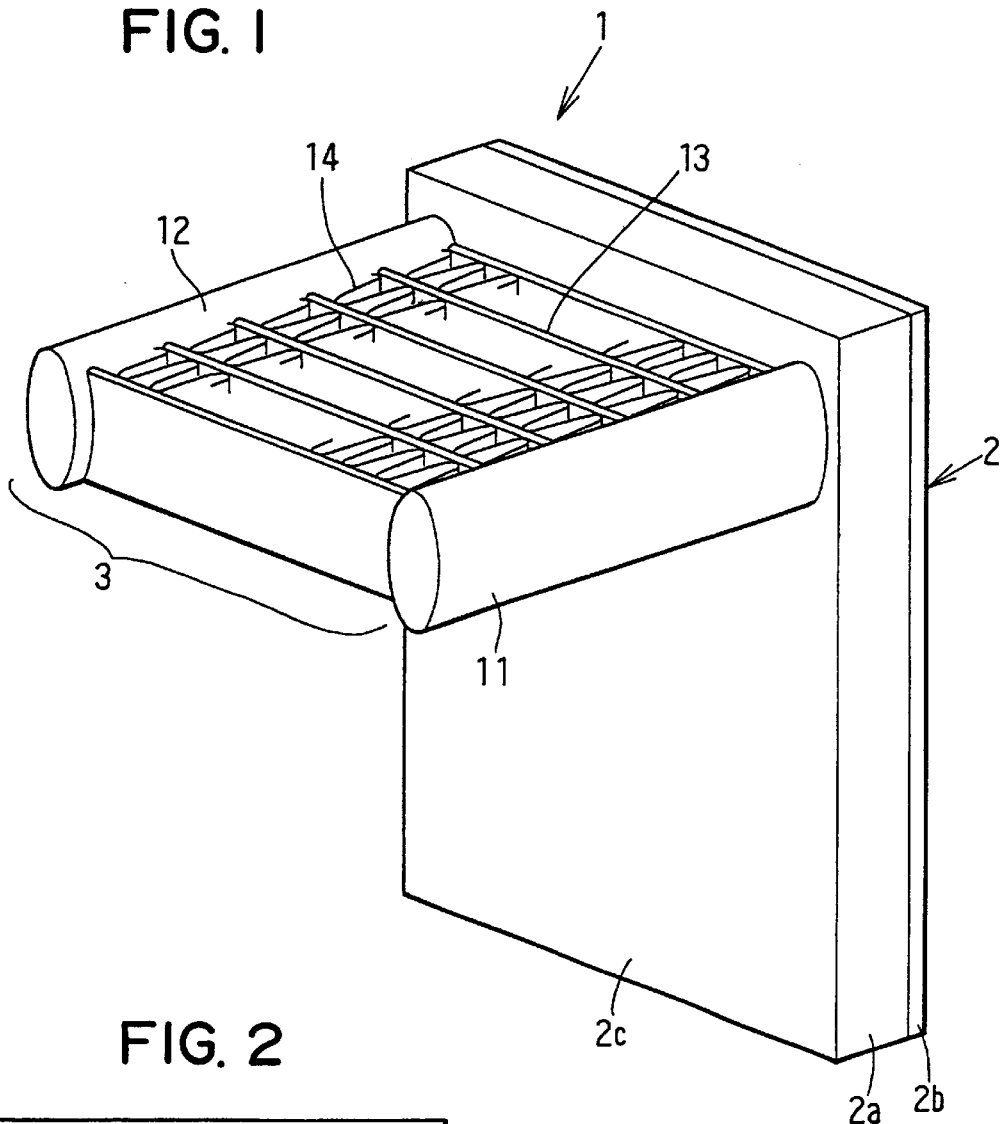
FIG. 1 is a perspective view of a cooling device according to a first preferred embodiment of the present invention.
Figure 2:
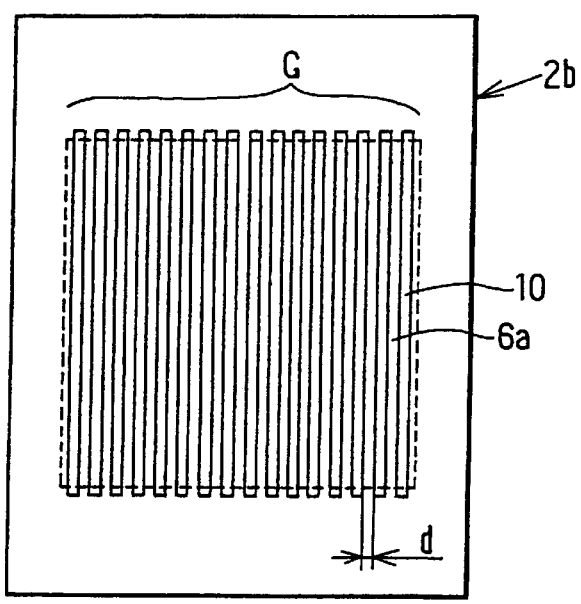
FIG. 2 is a plan view showing a cover plate of a refrigerant tank of the cooling device when being viewed from a rib side, according to the first embodiment.

A first preferred embodiment of the present invention is described with reference to FIGS. 1–8. As shown in FIG. 1, a cooling device 1 includes a refrigerant tank 2 in which liquid refrigerant (e.g., water, alcohol, fluorocarbon or flon) is stored, and a radiator 3 in which gas refrigerant boiled in the refrigerant tank 2 by heat generated from a heat-generating member is heat-exchanged with outside fluid (e.g., outside air) to be liquefied. The refrigerant tank 2 and the radiator 4 are integrally bonded through brazing.

The refrigerant tank 2 includes a thin receiver 2a and a cover plate 2b (i.e., outer wall plate) for covering an opened end surface of the thin receiver 2a. The refrigerant tank 2 is formed into a rectangular flat shape having a larger vertical dimension. Both the thin receiver 2a and the cover plate 2b are made of a metal such as aluminum having a sufficient heat-transmitting performance.

Figure 3:
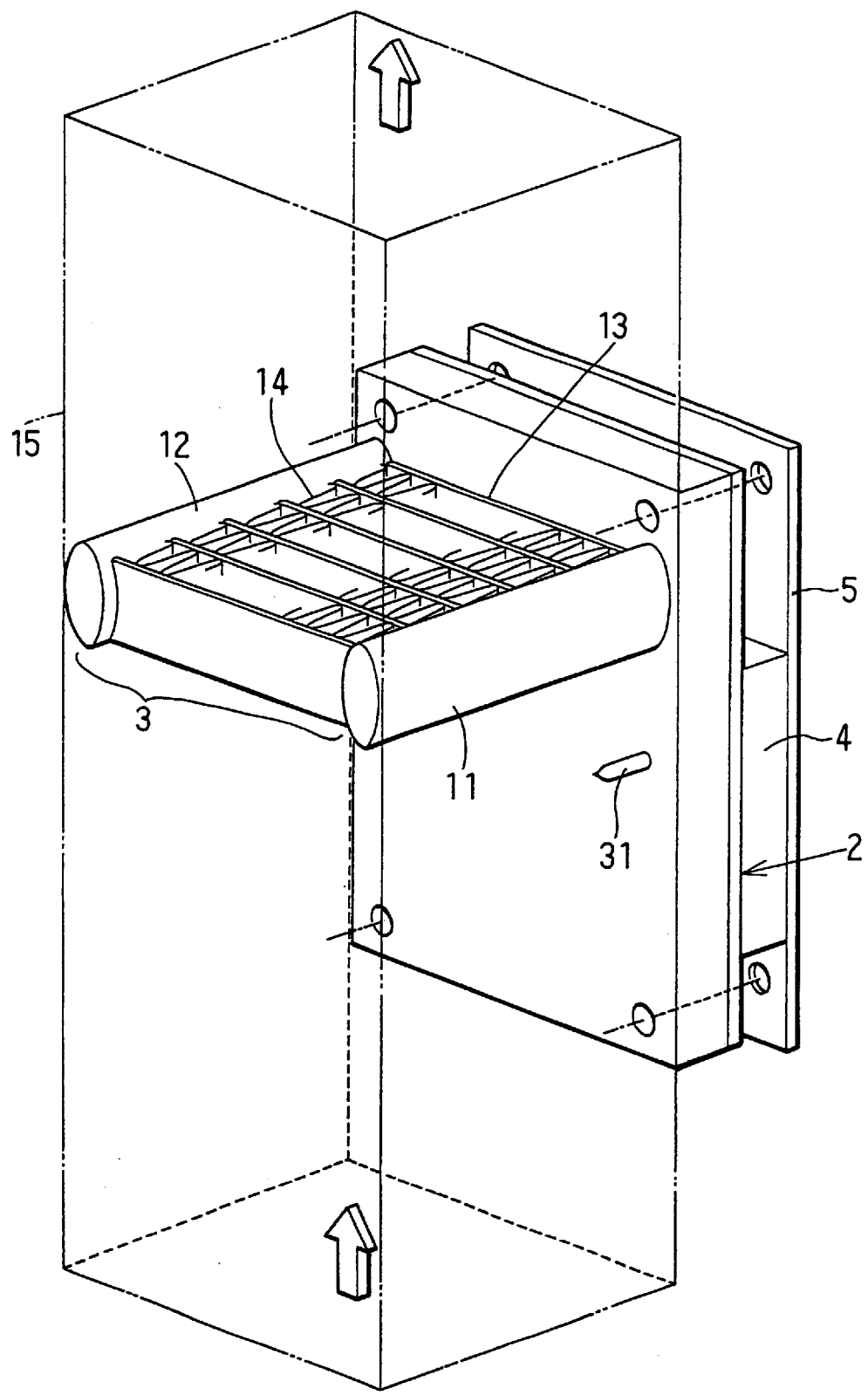
FIG. 3 is a perspective view showing a using state of the cooling device according to the first embodiment.

As shown in FIG. 3, the refrigerant tank 2 is used in an approximately vertical state. A CUP 4, which is a heat-generating member in the first embodiment, contacts one side surface of the refrigerant tank 2 in a thickness direction of the refrigerant tank 2. The refrigerant tank 2 is fixed by a bolt and the like to a printed base plate 5 onto which the CPU 4 is attached.

Figure 4:
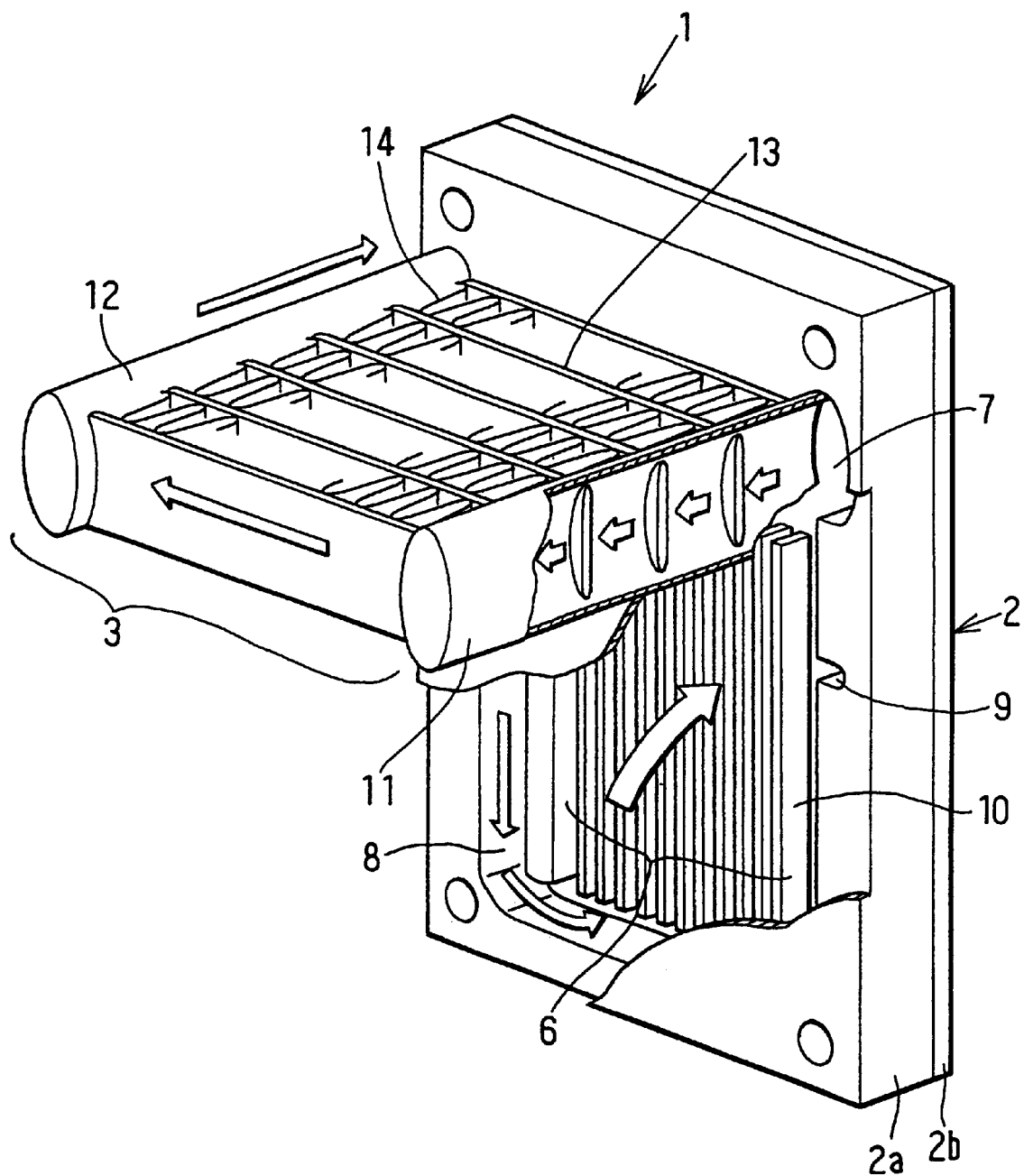
FIG. 4 is a perspective view showing an inner structure of the cooling device according to the first embodiment.

As shown in FIG. 4, the refrigerant tank 2 has therein a refrigerant chamber 6, a pair of header connection ports 7, a liquid-refrigerant returning passage 8 and a refrigerant inlet portion 9. The refrigerant chamber 6 is disposed at a position corresponding to the attachment portion of the CPU 4 to define a space in which liquid refrigerant is stored. That is, the attachment portion of the CPU 4 corresponds to a boiling surface of the refrigerant tank 2. As shown in FIG. 1, the refrigerant chamber 6 has a group structure G in which plural recesses are formed by plural ribs 10 provided on the cover plate 2b. Each top end surface of the ribs 10 in the thickness direction of the refrigerant tank 2 contacts an inner side surface of the thin receiver 2a to be bonded with the inner side surface of the thin receiver 2a, so that refrigerant passages 6a are defined by adjacent ribs 10.

The header connection ports 7 are provided at both upper sides of the refrigerant chamber 6, and are opened on the other side surface 2c of the refrigerant chamber 2, as shown in FIG. 1. In the first embodiment, one side header connection port 7 indicated in FIG. 4 communicates with an upper side of the refrigerant chamber 6 (i.e., each refrigerant passage 6a), and the other side header connection port 7 (not shown in FIG. 4) communicates with a lower side of the refrigerant chamber 6 (i.e., each refrigerant passage 6a) through the liquid-refrigerant returning passage 8.

The refrigerant inlet portion 9 is connected to an inlet pipe 31 through which refrigerant is introduced. The refrigerant inlet portion 9 is provided at a lower side of the one side header connection port 7 to communicate with the communication chamber 6. Refrigerant is poured from the refrigerant inlet portion 9 into the refrigerant chamber 6 until an approximate upper end position of the refrigerant chamber 6, lower than the header connection port 7.

Figure 5A:
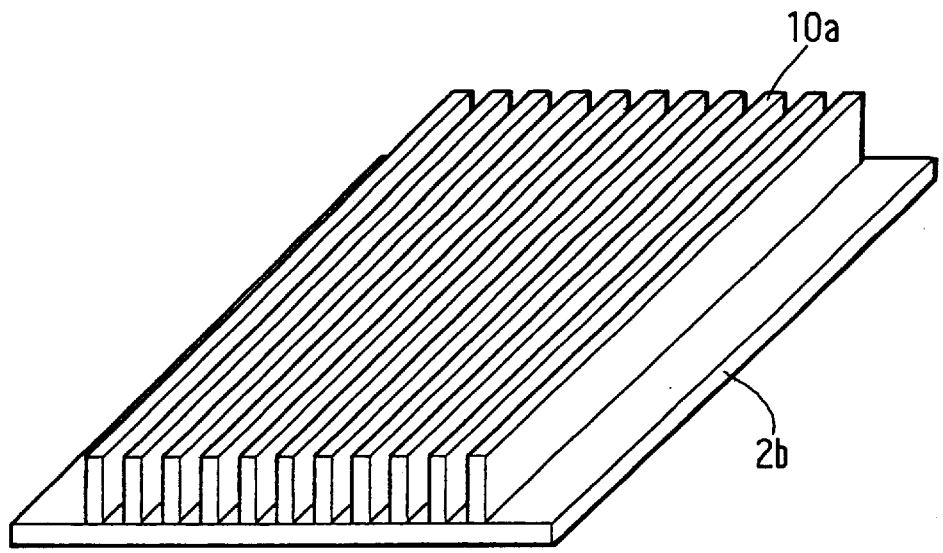
FIGS. 5A and 5B are a perspective view and a plan view, respectively, showing the cover plate of the refrigerant tank, according to the first embodiment.
Figure 5B:
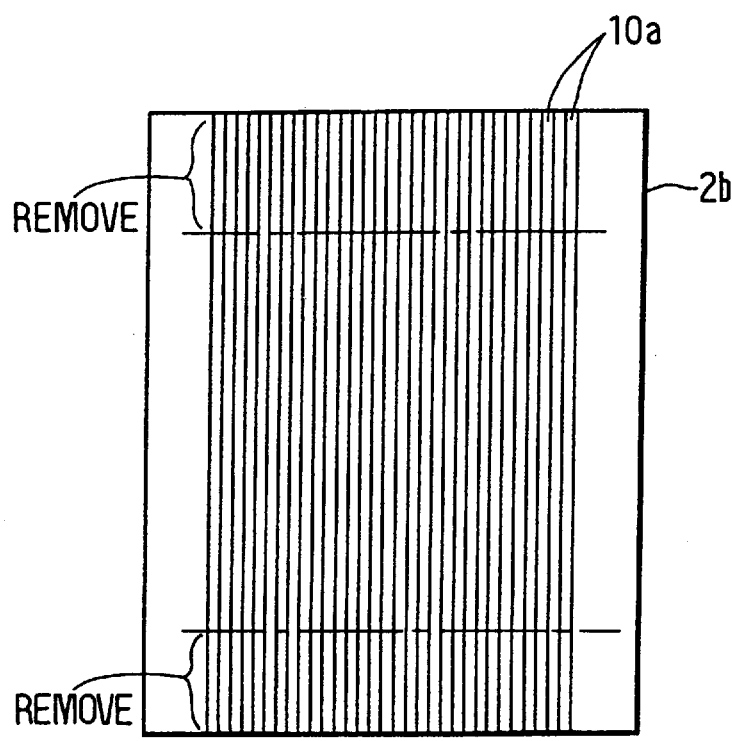

Next, the group structure G of the refrigerant chamber 6 will be now described. As shown in FIGS. 5A and 5B, plural protrusion portions 10a having a predetermined distance between adjacent two are integrally formed with the cover plate 2b through extrusion. Thereafter, both ends of each protrusion portion 10a in a longitudinal direction of each protrusion portion 10a are removed by a predetermined length so that the ribs 10 are formed. FIG. 5A is a perspective view of the cover plate 2b, and FIG. 5B is a plan view of the cover plate 2b. The length of each rib 10 is set to be slightly longer than a vertical dimension of the boiling surface indicated by the chain line in FIG. 1. In the first embodiment, the vertical dimension of the boiling surface is equal to the vertical length of the heat-generating member.

A passage width "d" of each refrigerant passage 6a formed by the ribs 10 is set to be equal to or smaller than double Laplace length L. Preferably, the passage width "d" of each refrigerant passage 6a is equal to or smaller than 1 mm. The Laplace length L is calculated by the following formula (1).

$$L=\sqrt{[\sigma/g(\rho_1-\rho_2)]} \quad (1)$$

wherein, "$\sigma$" is the surface tension of liquid refrigerant, "$\rho_1$" is the density of liquid refrigerant, "$\rho_2$" is the density of gas refrigerant, and "g" is the gravitational acceleration.

Figure 6:
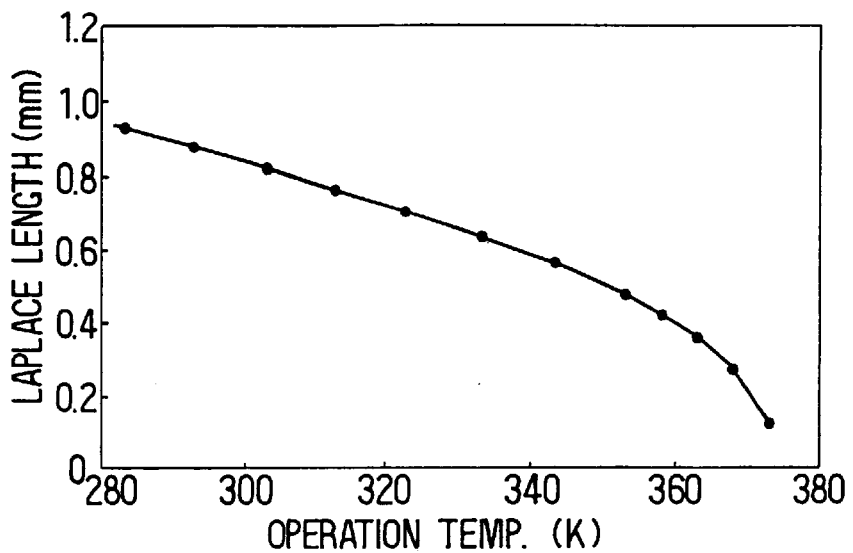
FIG. 6 is a graph showing the relationship between Laplace length and operation temperature of the cooling device, according to the first embodiment.

When operation temperature (refrigerant temperature) of the cooling device 1 is changed, the $\sigma$, the $\rho_1$ and the $\rho_2$ are changed. As shown in FIG. 6, the Laplace length L is set smaller as the operation temperature of the cooling device 1 becomes higher.

On the other hand, the radiator 3 includes gas-side and liquid-side headers 11, 12, and a radiator core portion constructed by plural radiator tubes 13 and plural radiator fins 14, as shown in FIG. 3. The radiator 3 is attached onto the other side surface 2c of the refrigerant tank 2. When the cooling device 1 operates, outside fluid (e.g., outside air) is introduced into the core portion of the radiator 3 through an air duct 15. Outside fluid introduced into the radiator 3 flows through the radiator upwardly from below by a cooling fan.

Refrigerant boiled in the refrigerant tank 2 by receiving heat from the CPU 4 flows into the gas-side header 11, and condensed liquid refrigerant condensed in the radiator tubes 13 of the radiator core flows into the liquid-side header 12. One-side longitudinal ends of the gas-side header 11 and the liquid-side header 12 are inserted into the refrigerant tanks 2 from the header connection ports 7 opened on the other surface 2c of the refrigerant tank 2, so that the radiator 3 is approximately vertically assembled relative to the refrigerant tank 2.

In the radiator core, each of the plural radiator fins 14 is disposed between adjacent radiator tubes 13. Each of the radiator tubes 13 is made of metal such as aluminum having a sufficient heat-transmitting performance, and is formed into a flat pipe shape which has a thin thickness relative to a width of outer surfaces contacting the radiator fins 14. Each one side end of the radiator tubes 13 is connected to the gas-side header 11, and each other side end thereof is connected to the liquid-side header 12. The radiator tubes 13 are disposed at predetermined intervals in parallel with each other between the gas-side header 11 and the liquid-side header 12. Each of the radiator fins 14 is formed into a wave shape by alternately bending a thin plate having a sufficient heat-transmitting performance.

Figure 7:
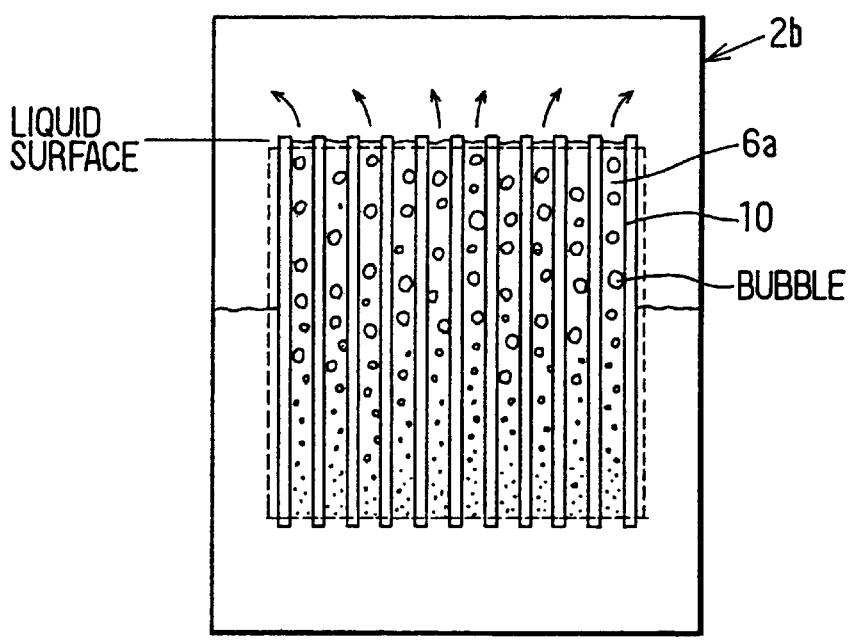
FIG. 7 is a view for explaining operation of a group structure of the refrigerant tank, according to the first embodiment.
Figure 8:
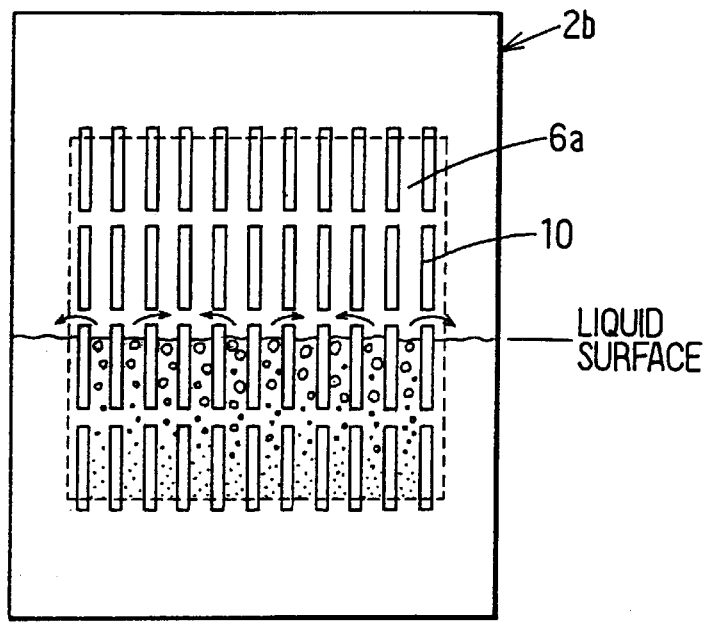
FIG. 8 is a view for explaining operation of a group structure of a refrigerant tank, according to a comparison example of the first embodiment.

Next, operation of the cooling device 1 according to the first embodiment of the present invention will be now described. Liquid refrigerant stored in the refrigerant chamber 6 is boiled and evaporated by heat generated from the CPU 4 to become bubbles, and the bubbles move upwardly in the refrigerant passages 6a of the refrigerant chamber 6. In the first embodiment, because the passage width "d" of the refrigerant passages 6a partitioned by the ribs 10 is set equal to or lower the double Laplace length (L), an outer diameter of the bubbles becomes larger than the passage width "d" of the refrigerant passages 6a. Therefore, the refrigerant passages 6a are closed by the bubbles. Accordingly, when bubbles moves upwardly in the refrigerant passages 6a of the refrigerant chamber 6, liquid refrigerant moves upwardly by bubbles, and the liquid surfaces of the refrigerant passages 6a rise as shown in FIG. 7.

Gas refrigerant introduced into the gas-side header 11 from the refrigerant passages 6a flows through radiator tubes 13 from the gas-side header 11 to be cooled by the outside fluid and to be condensed within the radiator tubes 13. Condensed liquid refrigerant becomes drops, and is pushed into the liquid-side header 12, and thereafter returns into the refrigerant tank 2 through liquid-refrigerant returning passage 8. The refrigerant flow of the cooling device 1 is indicated by arrows in FIG. 4.

According to the first embodiment of the present invention, the group structure G is provided on the boiling surface of the refrigerant chamber 6, and the passage width "d" is equal to or smaller than the double Laplace length "L". Therefore, the outer diameter of the bubbles becomes larger than the passage width "d" of the refrigerant passages 6a. As a result, liquid refrigerant rises as bubbles move upwardly, and the liquid-refrigerant surfaces of the refrigerant passages 6a can rise until approximate upper ends of the ribs 10. Thus, even when a gas refrigerant amount is increased, a decrease of the liquid-refrigerant surfaces of the refrigerant passages 6a can be prevented, and liquid refrigerant can be supplied to the boiling surface of the refrigerant chamber 6. Accordingly, it can prevent liquid refrigerant from being dried out on the boiling surface of the cooling device 1.

Further, because the ribs 10 defining the refrigerant passages 6a are integrally formed with the cover plate 2b, heat-transmitting area of the refrigerant chamber 6 is enlarged, and cooling capacity of the cooling device 1 can be improved. Further, because the ribs 10 are provided on the cover plate 2b, pressure-resistance strength of the refrigerant tank 2 is increased.

In the first embodiment of the present invention, because the refrigerant passages 6a are formed continuously in an up-down direction, liquid-refrigerant surface readily rises by the bubbles. When each rib 10 is separated into plural parts in the up-down direction, as shown by a comparison example of the first embodiment, bubbles generated by the lower part of the boiling surface are disturbed at the separated positions of the ribs 10, and it is impossible to move liquid refrigerant until the upper end side of the boiling surface of the cooling device 1. Thus, in the first embodiment of the present invention, the liquid refrigerant can be readily sufficiently moves upwardly until the upper side ends of the ribs 10, as compared with the comparison example.

In the above-described first embodiment, the cooling device 1 is used in an using state where the refrigerant tank 2 is approximately vertically positioned as shown in FIG. 1. However, the cooling device 1 may be used in an using state where the refrigerant tank 2 is approximately horizontally positioned.

Figure 9:
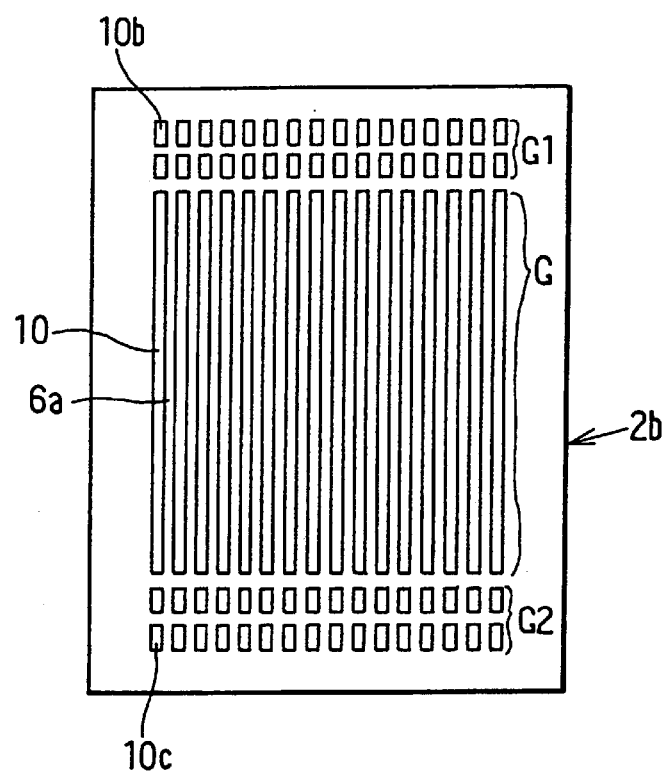
FIG. 9 is a plan view showing a cover plate of a refrigerant tank of a cooling device when being viewed from a rib side, according to a second preferred embodiment of the present invention.

A second preferred embodiment of the present invention will be now described with reference to FIG. 9. FIG. 9 is a plan view of the cover plate 2b when being viewed from a side of ribs. In the second embodiment, the cover plate 2b has the group structure G disposed on the boiling surface of the refrigerant chamber 6, and group structures G1, G2 provided at upper and lower sides of the group structure G. The group structure G is constructed by the ribs 10 described in the above-described first embodiment. On the other hand, the group structure G1 is constructed by plural short ribs 10b which are short and are not continuously provided in the longitudinal direction of each rib 10. Similarly, the group structure G2 is constructed by plural short ribs 10c which are short and are not continuously provided in the longitudinal direction of each rib 10. The cover plate 2b of the second embodiment is formed by partially removing the upper and lower parts of the protrusion portion 10a in FIGS. 5A, 5B, after the protrusion portion 10a is formed in the cover plate 2b by the extrusion. In the second embodiment of the present invention, in addition to the group structure G, the group structures G1, G2 are also provided. Therefore, heat-transmitting area of the refrigerant chamber 6 can be further increased and the pressure-resistance strength of the refrigerant tank 2 can be further improved, while the effect of the first embodiment is obtained. In the second embodiment, the other parts are similar to those of the above-described first embodiment of the present invention.

Figure 10:
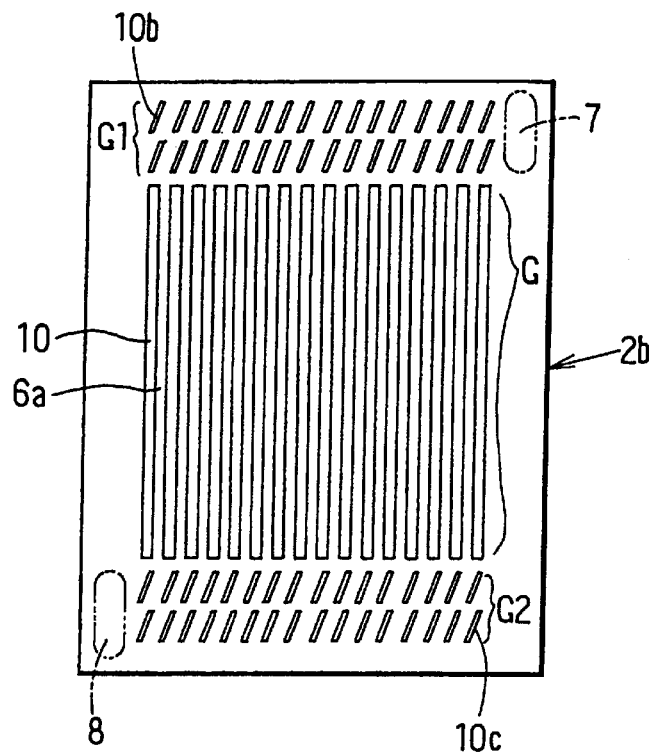
FIG. 10 is a plan view showing a cover plate of a refrigerant tank of a cooling device when being viewed from a rib side, according to a third preferred embodiment of the present invention.

A third preferred embodiment of the present invention will be now described with reference to FIG. 10. FIG. 10 is a plan view of the cover plate 2b when being viewed from a side of ribs, according to the third embodiment. In the third embodiment, the cover plate 2b has the group structure G disposed on the boiling surface of the refrigerant chamber 6, and group structures G1, G2 provided at upper and lower sides of the group structure G. The group structure G is constructed by the ribs 10 described in the first embodiment. On the other hand, the group structure G1 is constructed by plural short ribs 10b which are short and are not continuously provided in the longitudinal direction of each rib 10. Each upper end of the ribs 10b is tilted relative to the longitudinal direction of the ribs 10 toward the one side header connection port 7 which is gas-refrigerant outlet of the refrigerant tank 2. The group structure G2 is constructed by plural short ribs 10c which are short and are not continuously provided in the longitudinal direction of each rib 10. Each lower end of the ribs 10b is tilted relative to the longitudinal direction of the ribs 10 toward the outlet of the liquid-refrigerant returning passage 8. Thus, gas refrigerant rising from the refrigerant passages 6a of the group structure G readily flows into the one side header connection port 7 by the group structure G1. Further, liquid refrigerant flowing through the liquid-refrigerant returning passage 8 readily introduced into the refrigerant passages 6a of the group structure G by the ribs 10c of the group structure G2. As a result, refrigerant circulation in the refrigerant tank 2 can be facilitated.

Figure 11:
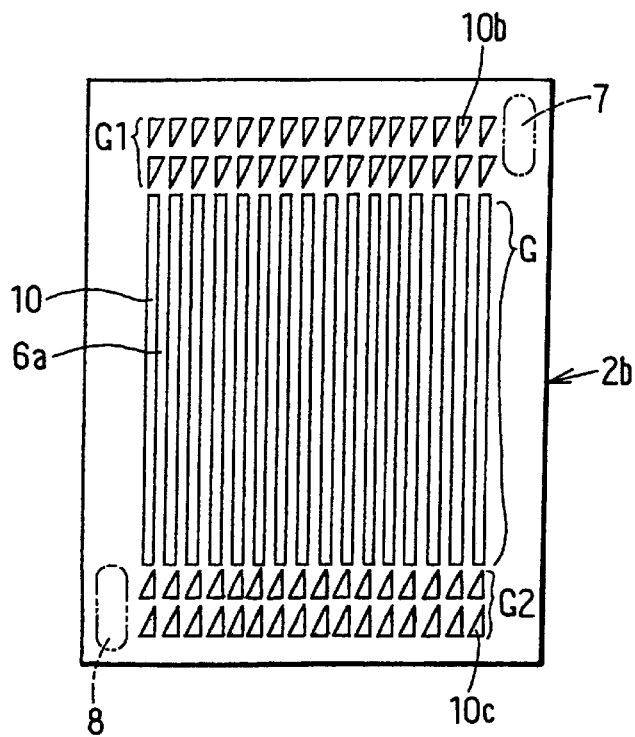
FIG. 11 is a plan view showing a cover plate of a refrigerant tank of a cooling device when being viewed from a rib side, according to a fourth preferred embodiment of the present invention.

A fourth preferred embodiment of the present invention will be now described with reference to FIG. 11. FIG. 11 is a plan view of the cover plate 2b when being viewed from a side of ribs, according to the fourth embodiment. In the fourth embodiment, the cover plate 2b has the group structure G disposed on the boiling surface of the refrigerant chamber 6, and group structures G1, G2 provided at upper and lower sides of the group structure G. In the fourth embodiment, the shapes of the ribs 10b, 10c are different from that of the above-described third embodiment; however, the effect similar to that of the third embodiment can be obtained.

A fifth preferred embodiment of the present invention will be now described with reference to FIGS. 12A–15E. A cooling device 1 of the fifth embodiment includes a refrigerant tank 2 and a radiator 3, similarly to the above-described first embodiment. Further, as shown in FIG. 3 of the above-described first embodiment, the refrigerant tank 2 is fixed by a bolt and the like to the printed base plate 5 onto which a heat-generating member 4 such as CUP is attached. Refrigerant within the refrigerant tank 2 receives heat of the heat-generating member 4 through a heat-receiving wall 23 to be boiled, and boiled gas refrigerant is introduced into the radiator 3. In the radiator 3, gas refrigerant is heat-exchanged with outside fluid (e.g., outside air) and is condensed. The refrigerant tank 2 and the radiator 3 are integrated through brazing. Generally, outside fluid passes through the radiator 3 upwardly from below.

The refrigerant tank 2 is formed into a flat box like, and is made of metal such as aluminum having a sufficient heat-transmitting performance. As shown in FIGS. 12A and 12B, the refrigerant tank 2 is used in an approximate vertical state while being immersed by liquid refrigerant 27. The heat-generating member 4 is attached by using screws and the like onto an attachment surface 23a of the heat-receiving wall 23 while contacting the attachment surface 23a. The refrigerant tank 2 includes the heat-receiving wall 23 having the attachment surface 23a, a heat-radiating wall 28 opposite to the heat-receiving wall 23 to form a refrigerant receiver therebetween, and plural connection members 23b for holding a predetermined distance between both the heat-receiving wall 23 and the heat-radiating wall 28 and for defining plural spaces through which the refrigerant 27 flows.

Figure 13A:
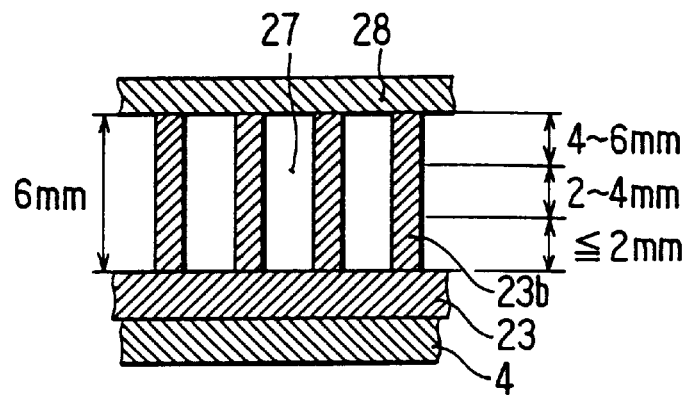
FIG. 13A is a schematic sectional view showing a part of the refrigerant tank according to the fifth embodiment.
Figure 13B:
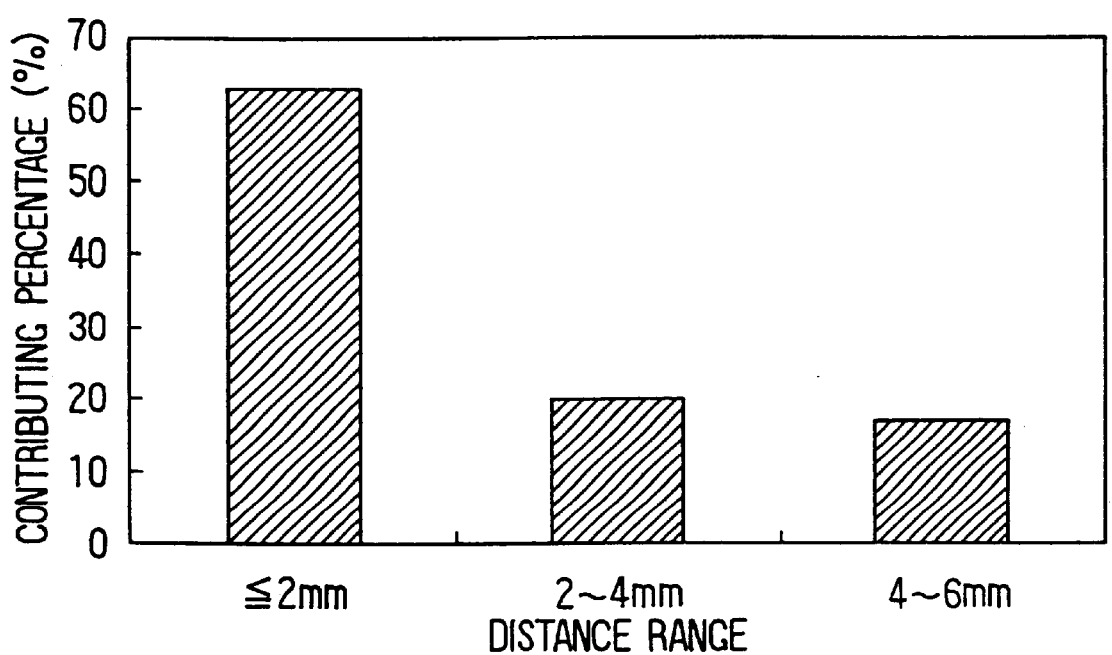
FIG. 13B is a graph showing the relationship between a distance range from a heat-receiving wall and a contributing percentage of heat transition from an inner side surface of the heat-receiving wall to refrigerant, according to the fifth embodiment.

An inner surface area of the heat-receiving wall 23, opposite to the heat-generating member 4 and a position around the heat-generating member 4, is set to entirely or partially have a high-contributing percentage of heat-transmission from an inner side surface of the heat-receiving wall 23 to the refrigerant 27. FIG. 13A is a schematic sectional view showing a distance range from the inner side surface of the heat-receiving wall 23 within the refrigerant tank 2, and FIG. 13B is a graph showing the relationship between the distance range from the inner side surface of the heat-receiving wall 23 and the contributing percentage of heat-transmission from an inner side surface of the heat-receiving wall 23 to the refrigerant 27. According to experiments, as shown in FIG. 13B, when the distance range from the inner side surface of the heat-receiving wall 23 at a position most proximate to the attachment surface 23a is not larger than 2 mm, the contributing percentage of heat-transmission from an inner side surface of the heat-receiving wall 23 to the refrigerant 27 becomes higher as compared with the other distance range. Therefore, as shown in FIG. 12B, a porous layer 24 is disposed in the distance range not larger than 2 mm.

The porous layer 24 can be made of an aluminum alloy having a sufficient heat-transmitting performance. The porous layer 24 is a sintered metal, a metal fiber, a metal mesh, a foam metal or the like which is press-formed by pressing a fine grain metal, a powder metal, a wire metal, a rod-like metal, a metal wire or the like. The porous layer 24 defining fine cavities is used for increasing a contact area with the refrigerant 27.

Figure 14:
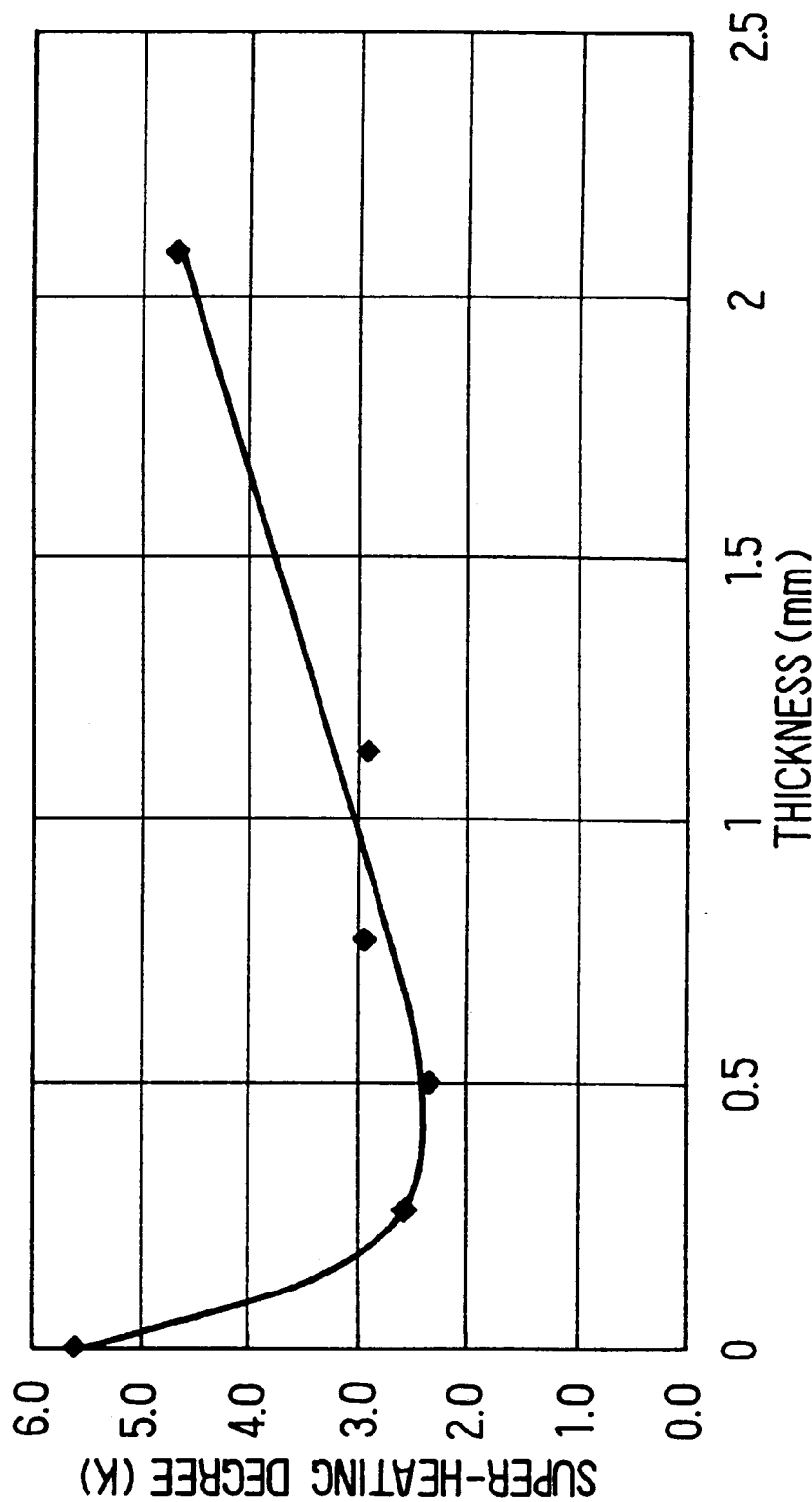
FIG. 14 is a graph showing the relationship between a super-heating degree and a thickness of a porous layer, according to the fifth embodiment.
Figure 15:
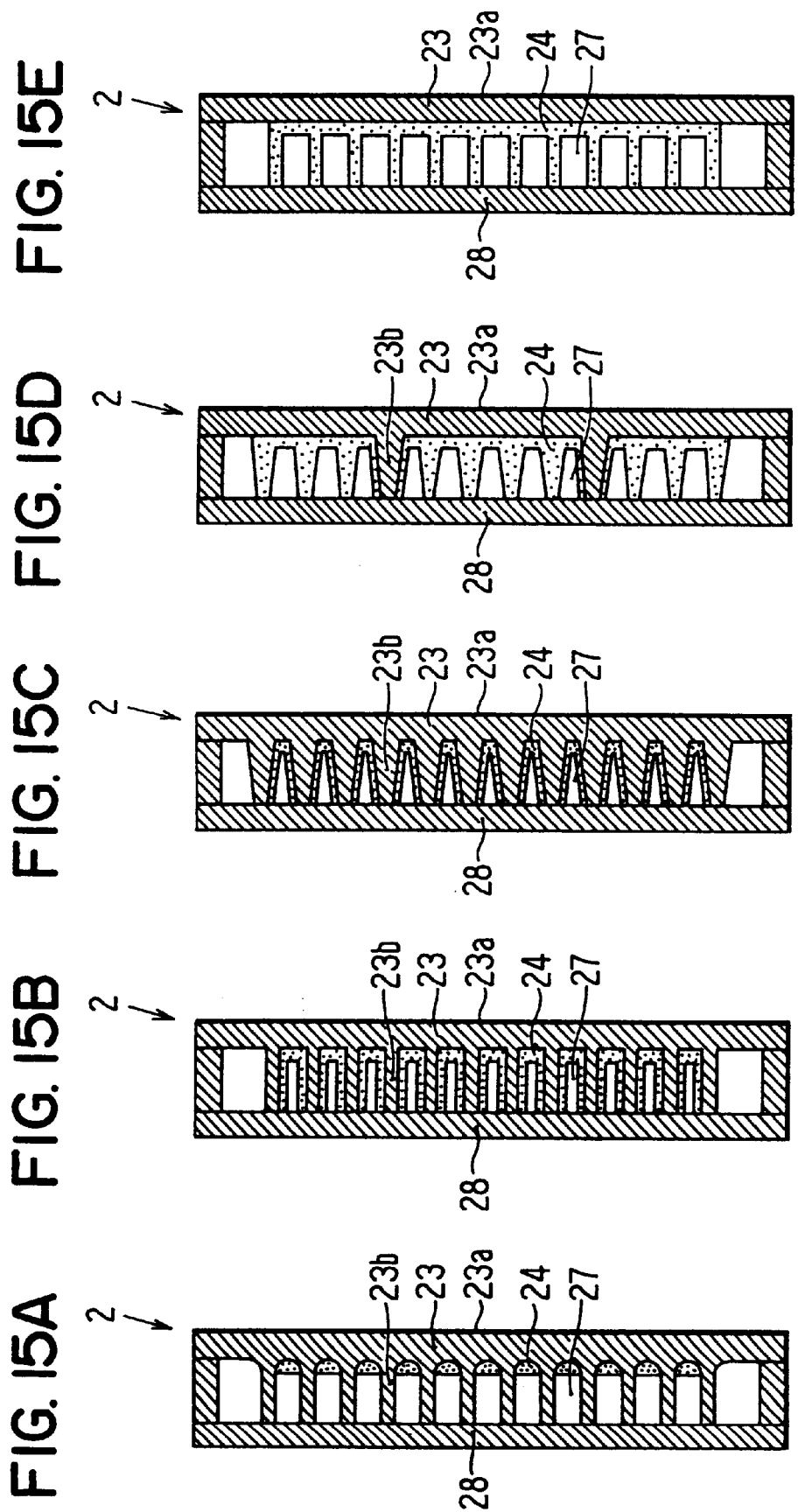
FIGS. 15A–15E are sectional views, respectively, showing different refrigerant tanks, according to modifications of the fifth embodiment.

The porous layer 24 is provided to have a predetermined thickness and a hole percentage. FIG. 14 shows experimental results performed by using the porous layer 24 of an aluminum alloy and flon refrigerant. As shown in FIG. 14, a super-heating degree of the heat-transmitting surface is changed as the thickness of the porous layer 24 changes. Specifically, when the thickness of the porous layer 24 is equal to or lower than 2 mm, the super-heating degree of the heat-transmitting surface can be reduced. More preferably, when the thickness of the porous layer 24 is in a range of 0.2 mm–1 mm, the super-heating degree of the heat-transmitting surface can be further reduced. On the other hand, when the hole percentage of the porous layer 24 is set to be equal to or larger than 20%, heat of the heat-receiving wall 23 is effectively transmitted to the refrigerant 27. More preferably, when the hole percentage of the porous layer 24 is set to be equal to or larger than 50%, heat of the heat-receiving wall 23 is further effectively transmitted to the refrigerant 27, and the super-heating degree of the heat-transmitting surface can be further reduced.

The porous layer 24 is formed into a plate-like approximately corresponding to an inner surface of the heat-receiving wall 23. For obtaining a sufficient heat transmission between the heat-receiving wall 23 and the porous layer 24, the porous layer 24 is bonded to the inner surface of the heat-receiving wall 23. For example, the porous layer 24 may be integrally formed with the heat-receiving wall 23 by sintering, brazing or the like.

Next, operation of the cooling device according to the fifth embodiment will be now described. Heat generated by the heat-generating member 4 is transmitted into the refrigerant tank 2 from the attachment surface 23a, so that liquid refrigerant 27 around inside the heat-receiving wall 23 is boiled. Boiled gas refrigerant flows into the radiator 3, and is cooled and condensed in the radiator 3 to become the liquid refrigerant. Liquid refrigerant returns the refrigerant tank 2, and repeats the evaporation operation and the condensation operation.

In the fifth embodiment of the present invention, the connection members 23b can be provided to correspond to the ribs 10 of the above-described first embodiment. In this case, the same effect as the above-described first embodiment can be also obtained.

In the above-described fifth embodiment of the present invention, the sectional shapes of the connection members 23b and the porous layer 24 can be changed as indicated in FIGS. 15A–15E, for example. As shown in FIG. 15A, a sectional shape of base of each connection member 23b is formed into a circular arc shape. In this case, the heat-receiving wall 23 is readily formed through extrusion, and the porous layer 24 is readily uniformly formed in each circular arc bottom of the connection members 23b by pressing.

In FIG. 5B, the porous layer 24 is also provided on wall surfaces of the connection member 23b, in addition to the inner surface of the heat-receiving wall 23 and the base of the connection members 23b. Therefore, evaporation effect of liquid refrigerant on the wall surfaces of the connection members 23b is improved, and the super-heating degree of the heat-transmitting surface can be reduced.

FIG. 15C is a modification of FIG. 15B. In FIG. 15C, each of the connection members 23b tapers from the base.

Further, in FIGS. 15D and 15E, a part of the connection members 23b formed on the heat-receiving wall 23 or the whole part of the connection members 23b are formed by the porous layer 24. In this case, the evaporation effect of the liquid refrigerant 27 is further increased in the connection members 23b so that the super-heating degree of the heat-transmitting surface is reduced, while the porous layer 24 is used as the connection members 23b. Thus, the number of components of the cooling device 1 can be reduced.

Figure 16:
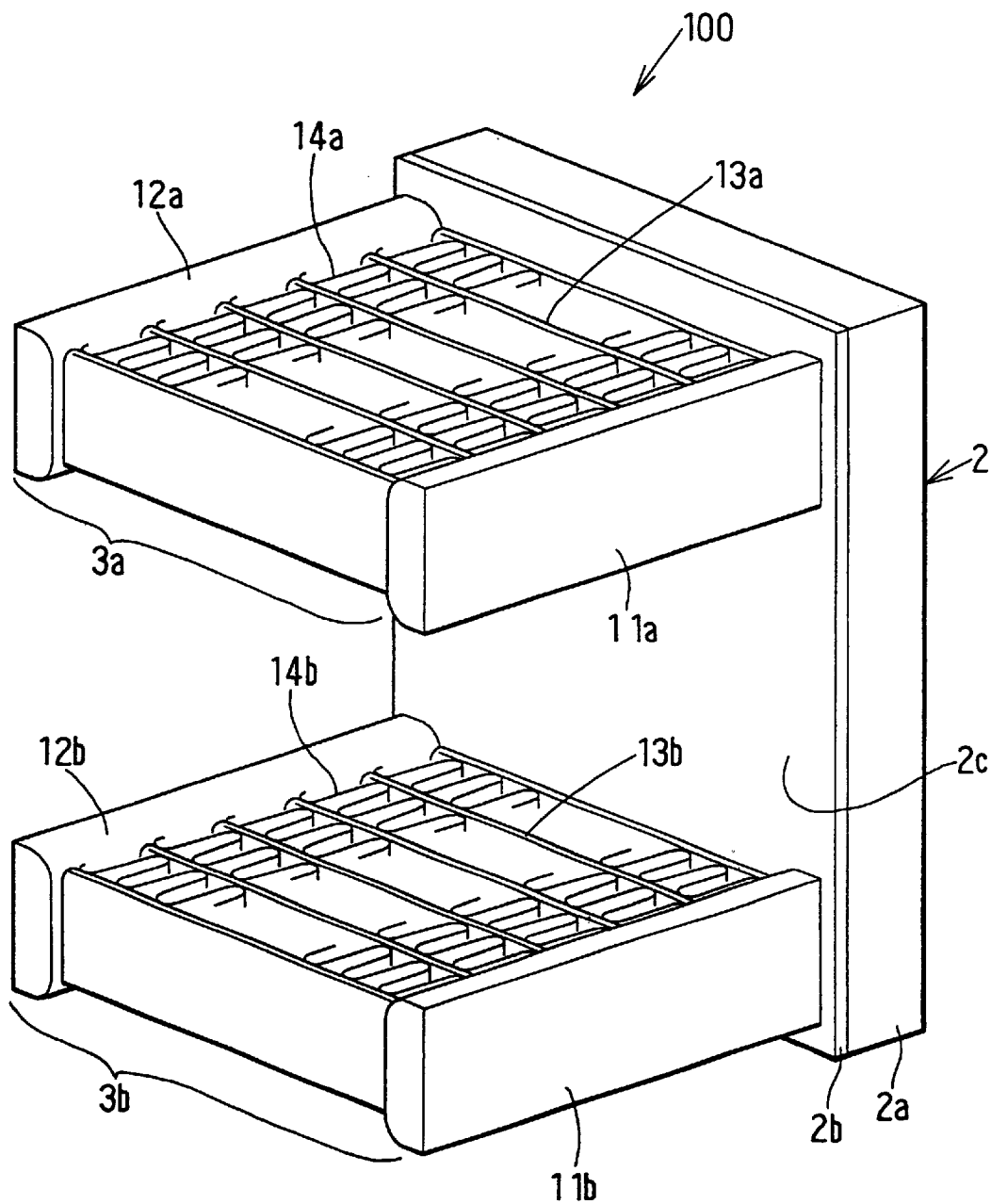
FIG. 16 is a perspective view of a cooling device according to a sixth preferred embodiment of the present invention.

A sixth preferred embodiment of the present invention will be now described with reference to FIGS. 16–19. Similarly to the above-described first embodiment, in the sixth embodiment, a cooling device 100 is typically used for cooling a heat-generating member such as a CPU 4. As shown in FIG. 16, the cooling device 100 includes a refrigerant tank 2 in which liquid refrigerant (e.g., water, alcohol, fluorocarbon or flon) is stored, and first and second radiators 3a, 3b in which gas refrigerant boiled in the refrigerant tank 2 by heat generated from the heat-generating member 2 is heat-exchanged with outside fluid (e.g., cool air) to be liquefied. The refrigerant tank 2 and the radiators 3a, 3b are integrally bonded through brazing.

The refrigerant tank 2 is formed into a flat rectangular shape. The refrigerant tank 2 includes a thin receiver 2a and a cover plate 2b (i.e., outer wall plate) for covering an opened end surface of the thin receiver 2a. The refrigerant tank 2 is formed into a rectangular flat shape having a larger vertical dimension. Both the thin receiver 2a and the cover plate 2b are made of a metal such as aluminum having a sufficient heat-transmitting performance.

Figure 19:
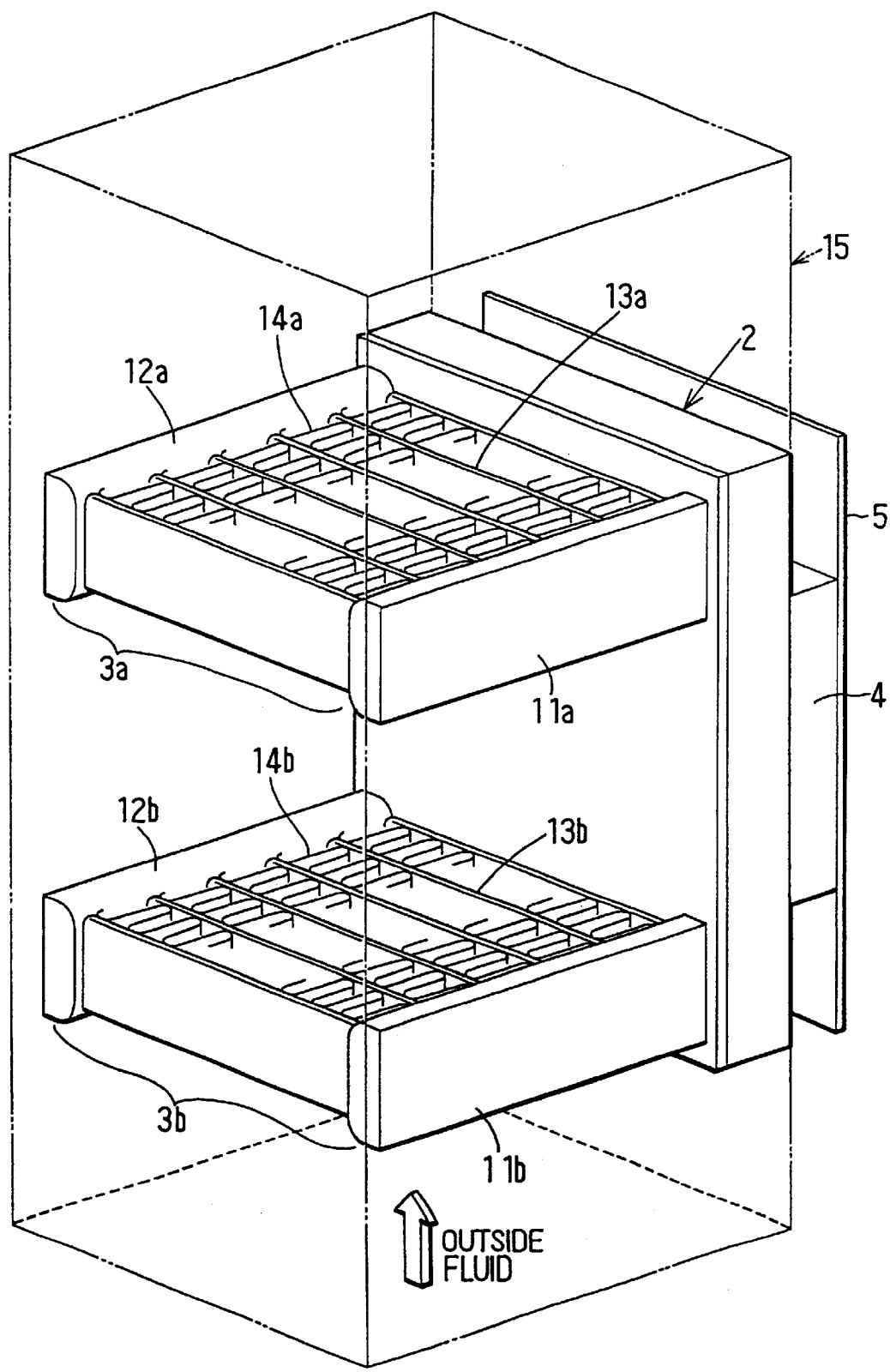
FIG. 19 is a perspective view showing a using state of the cooling device according to the sixth embodiment.

As shown in FIG. 19, the refrigerant tank 2 is used in an approximately vertical state. A heat-radiating surface of the CUP 4 contacts one side surface of the refrigerant tank 2 in a thickness direction of the refrigerant tank 2. The refrigerant tank 2 is fixed by a bolt and the like to a printed base plate 5 onto which the CUP 4 is attached, as shown in FIG. 19.

As shown in FIG. 18, the refrigerant tank 2 includes a refrigerant chamber 6 (boiling space) in which refrigerant is boiled by heat from the CUP 4 attached onto the attachment position 4a of the flat surface of the refrigerant tank 2, first header connection portions 38a, 39a, second header connection portions 38b, 39b, and a communication passage 30 through which the first and second header connection portions 38b, 39b at the left side in FIG. 18 communicate with each other. The refrigerant chamber 6 is provided so that heat from the CUP 4 is readily transmitted to refrigerant within the refrigerant tank 2. In the sixth embodiment, the refrigerant chambers 6 are partitioned by plural ribs (not shown) into plural passages extending in up-down direction.

The first header connection portions 38a, 39a of the refrigerant tank 2 are respectively connected to first and second headers 11a, 12a of the first radiator 3a, and the second header connection portions 38b, 39b of the refrigerant tank 2 are respectively connected to first and second headers 11b, 12b of the second radiator 3b. Therefore, as shown in FIGS. 17, 18, the first header connection portions 38a, 39a of the radiator 2 have sectional shapes corresponding to those of the first and second headers 11a, 12a of the first radiator 3a, and the second header connection portions 38b, 39b of the radiator 2 have sectional shapes corresponding to those of the first and second headers 11b, 12b of the second radiator 3b. In the sixth embodiment, on a surface 2c opposite to the flat surface where the CPU 4 is attached, the first header connection portions 38a, 39a are provided at one side of the refrigerant tank 2 in a vertical direction, and the second header connection portions 38b, 39b are provided at the other side of the refrigerant tank 2 in the vertical direction.

Specifically, the first header connection portion 38a is provided at an upper right side of the refrigerant chamber 6 in FIG. 18 adjacent to the refrigerant chamber 6 to communicate with the refrigerant chamber 6, and the first header connection portion 39a is provided at an upper left side of the refrigerant chamber 6 in FIG. 18 to be separated from the refrigerant chamber 6. On the other hand, the second header connection portion 38b is provided at a lower right side of the refrigerant chamber 6 in FIG. 18 adjacent to the refrigerant chamber 6 to communicate with the refrigerant chamber 6, and the second header connection portion 39b is provided at a lower left side of the refrigerant chamber 6 in FIG. 18 to be separated from the refrigerant chamber 6. Through the communication passage 30, condensed liquid refrigerant condensed in the first radiator 3a is introduced into the second radiator 3b. In the sixth embodiment, the communication passage 30 is provided, so that the first header connection portion 39a and the second header connection portion 39b communicate with each other through the communication passage 30. Liquid refrigerant sealed in the refrigerant tank 2 has a liquid surface slightly lower than lower ends of the first header connection portions 38a, 39a.

The first radiator 3a is disposed at an upper side of the refrigerant tank 2 in FIG. 16 above from the refrigerant liquid surface within the refrigerant tank 2, and the second radiator 3b is disposed at a lower side of the refrigerant tank 2 in FIG. 16.

The first radiator 3a includes a pair of the first and second headers 11a, 12a, plural first radiator tubes 13a disposed between the first and second headers 11a, 12a to communicate with the first and second headers 11a, 12a, and plural first radiator fins 13a each of which is disposed between adjacent first radiator tubes 13a. The first radiator tubes 13a are arranged in the longitudinal direction of the first and second headers 11a, 12a to have a predetermined distance between adjacent radiator tubes 13a. Each one side end of the first radiator tubes 13a is connected to the first header 11a, and each other side end thereof is connected to the second header 12a. Each of the first radiator fins 14a is formed into a wave shape by alternately bending a thin metal plate (e.g., aluminum plate), and is brazed to outer surfaces of the first radiator tubes 13a.

The first header 11a of the first radiator 3a is inserted into the first header connection portion 38a of the refrigerant tank 2 on the upper right side to communicate with the refrigerant chamber 6 of the refrigerant tank 2. The first header 11a is connected to the other side surface 2c of the refrigerant tank 2 approximately vertically relative to the other side surface 2c of the refrigerant tank 2.

On the other hand, the second header 12a of the first radiator 3a is inserted into the first header connection portion 39a of the refrigerant tank 2 on the upper left side. The second header 12a of the first radiator 3a is connected to the refrigerant tank 2 approximately vertically relative to the refrigerant tank 2 in parallel with the first header 11a.

The second radiator 3b includes a pair of the first and second headers 11b, 12b, plural second radiator tubes 13b disposed between the first and second headers 11b, 12b to communicate with the first and second headers 11b, 12b, and plural second radiator fins 14b each of which is disposed between adjacent second radiator tubes 13b, similarly to the first radiator 3a.

The first header 11b of the second radiator 3b is inserted into the second header connection portion 38b of the refrigerant tank 2 on the lower right side to communicate with the refrigerant chamber 6 of the refrigerant tank 2. The first header 11b of the second radiator 3b is connected to the refrigerant tank 2 approximately vertically relative to the other surface 2c of the refrigerant tank 2.

On the other hand, the second header 12b of the second radiator 3b is inserted into the second header connection portion 39b of the refrigerant tank 2 on the lower left side. The second header 12b is connected to the refrigerant tank 2 approximately vertically relative to the other surface 2c of the refrigerant tank 2 in parallel with the first header 11b of the second radiator 3b.

The first radiator 3a and the second radiator 3b are connected to the refrigerant tank 2 to have an approximate equal distance from a center of the refrigerant tank 2 in the up-down direction.

Further, in the sixth embodiment, as shown in FIG. 17, each width dimension A of the first and second radiators 3a, 3b on the right-left direction is set smaller than a width dimension B of the refrigerant tank 2 in the right-left direction.

As shown in FIG. 19, outside fluid is blown toward the first and second radiators 3a, 3b through an air passage defined by a duct 15. The duct 15 is disposed to enclose the first radiator 3a and the second radiator 3b. An inner side surface 15a of the duct 15 contacts both outer side surfaces of the refrigerant tank 2, or is disposed to have a slight clearance between the outer side surfaces of the refrigerant tank 2 and the inner side surface 15a of the duct 15, as shown in FIG. 17. Therefore, a predetermined clearance can be maintained between the inner side surface 15a of the duct 15 and each outer side surface of the headers 11a, 12a, 11b, 12b, as shown in FIG. 17.

Here, a clearance between each outer side surface of the first and second headers 11b, 12b of the second radiator 3b and the inner side surface 15a of the duct 15 is indicated as a first clearance S1, and a clearance between each outer side surface of the first and second headers 11a, 12a of the first radiator 3a and the inner side surface 15a of the duct 15 is indicated as a second clearance S2. As shown in FIG. 17, outside fluid bypasses the second radiator 3b through the first clearance S1.

In FIG. 19, outside fluid (e.g., cool air) firstly flows upwardly through the second radiator 3b from below, and then flows upwardly through the first radiator 3a from below, through the outside fluid passage of the duct 15.

Next, operation of the cooling device 100 according to the sixth embodiment of the present invention will be now described. Liquid refrigerant stored in the refrigerant chamber (i.e., boiling space) 6 is boiled in the refrigerant chamber 6 by heat from the CPU 4, boiled gas refrigerant flows into the first header 11a of the first radiator 3a from the refrigerant chamber 6, and passes through the first radiator 3a. That is, gas refrigerant from the refrigerant chamber 6 flows into the first header 11a, passes through the first radiator tubes 13a and flows into the second header 12a, while being cooled and condensed by outside fluid passing through the first radiator 3a.

Refrigerant cooled and condensed in the first radiator 3a flows into the second header 12b of the second radiator 3b through the communication passage 30 provided in the refrigerant tank 2. In the second radiator 3b, refrigerant flows through the second radiator tubes 13b from the second header 12b toward the first header 11b while being further cooled and condensed therein, and thereafter returns into the refrigerant chamber 6 from the first header 11b of the second radiator 3b. In the second radiator 3b, because condensed liquid refrigerant flows in a low speed, it is possible to cool refrigerant approximately until a temperature of outside fluid.

According to the sixth embodiment of the present invention, because the first clearance S1 is provided between each outer side surface of the first and second headers 11b, 12b and the inner side surface 15a of the duct 15, a part of outside fluid supplying from a lower side of the second radiator 3b passes through the first clearance S1 while bypassing the second radiator 3b, as shown in FIG. 17. Temperature of outside fluid passing through the first clearance S1 is hardly increased. Therefore, in the sixth embodiment, low-temperature outside fluid can be supplied to the first radiator 3a, as compared with a case without the first clearance S1. That is, when the first clearance S1 is not provided, only outside fluid having passed through the second radiator 3b is introduced into the first radiator 3a. Accordingly, in the sixth embodiment, heat-radiating capacity of the first radiator 3a can be improved due to the first clearance S1.

Further, because the second clearance S2 is also provided between each outer side surface of the first and second headers 11a, 12a of the first radiator 3a and the inner side surface 15a of the duct 15, the same effect can be obtained even when the cooling device 100 is reversely used in the up-down direction.

A seventh preferred embodiment of the present invention will be now described with reference to FIG. 20. FIG. 20 is a front view of a cooling device when being viewed from a side of the radiators 3a, 3b. As shown in FIG. 20, a packing 18 (gasket) is detachably disposed in the second clearance S2. Therefore, the second clearance S2 is sealed by the packing 18 so that outside fluid does not passes through the second clearance S2. Accordingly, outside fluid can be effectively supplied to the first radiator 3a, and all low-temperature outside fluid passing through the first clearance S1 can be supplied to the first radiator 3a. Further, because the packing 18 is detachably disposed, the cooling device can be reversely used in the up-down direction. In the seventh embodiment, the other portions of the cooling device are similar to those of the above-described sixth embodiment.

An eighth preferred embodiment of the present invention will be now described with reference to FIG. 21. FIG. 21 is a front view of a cooling device when being viewed from a side of the radiators 3a, 3b. As shown in FIG. 21, the width dimension of the second radiator 3b is set shorter than that of the first radiator 3a. The width dimension of the second radiator 3b is a distance between an outer side surface of the first header 11b and an outer side surface of the second header 12b. Therefore, a dimension of the first clearance S1 can be made larger, and an amount of outside fluid passing through the first clearance S1 while bypassing the second radiator 3b is increased. Accordingly, the temperature of outside fluid supplied into the first radiator 3a can be further decreased. In the eighth embodiment, the other portions are similar to those of the above-described sixth embodiment of the present invention.

Figure 23:
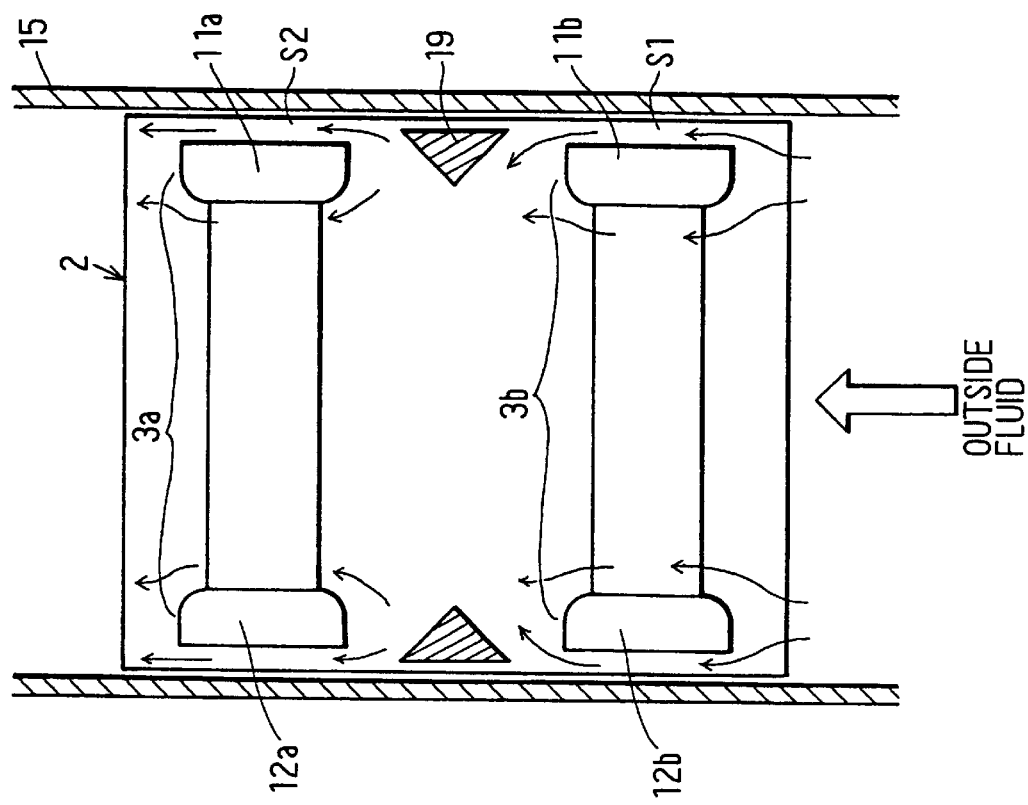
FIG. 23 is a front view of a cooling device when being viewed from the radiator side according to the ninth embodiment.
Figure 22:
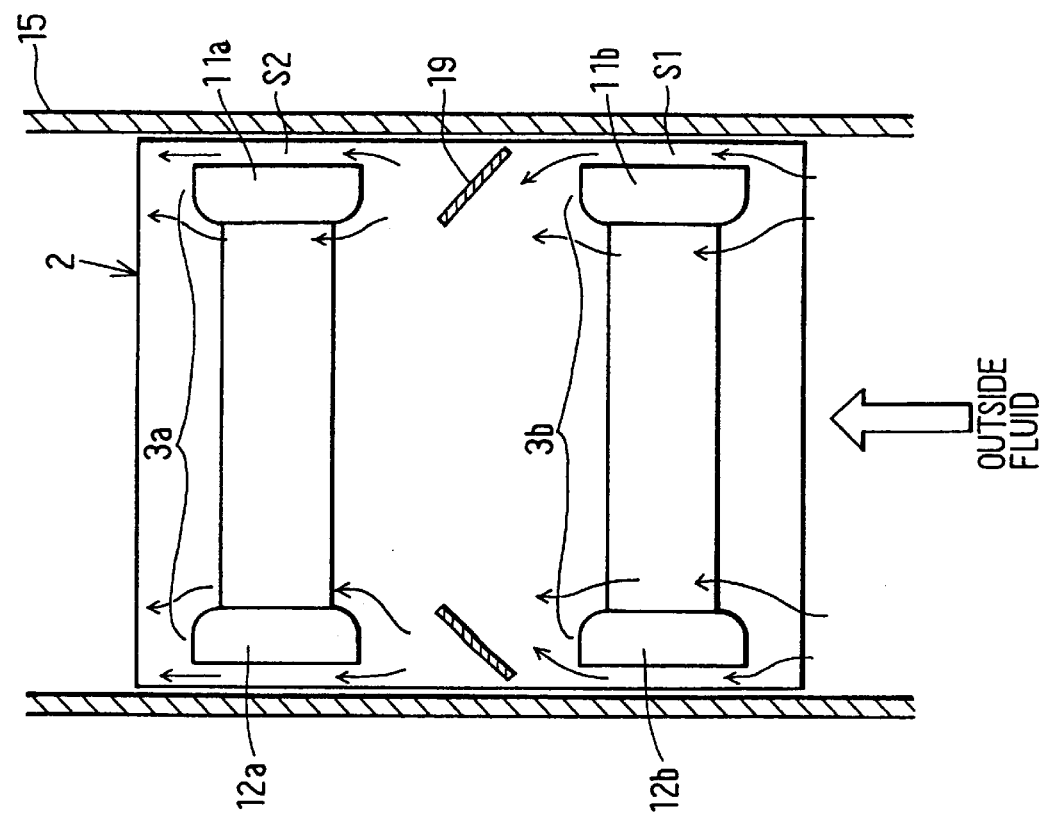
FIG. 22 is a front view of a cooling device when being viewed from a radiator side according to a ninth preferred embodiment of the present invention.

A ninth preferred embodiment of the present invention will be now described with reference to FIGS. 22 and 23. FIGS. 22 and 23 are front views of cooling device, respectively, when being viewed from a side of the radiators 3a, 3b. As shown in FIGS. 22 and 23, a guide 19 for introducing outside fluid having passed through the first clearance S1 into the first radiator 3a is disposed at a downstream side of the first and second headers 11b, 12b of the second radiator 3b in a flow direction of outside fluid. The shape of the guide 19 can be changed as shown in FIGS. 22, 23, for example. In the ninth embodiment, low-temperature outside fluid having passed through the first clearance S1 can be effectively supplied to the first radiator 3a by the guide 19. In the ninth embodiment, the other portions of the cooling device are similar to those of the above-described sixth embodiment of the present invention.

A tenth preferred embodiment of the present invention will be now described with reference to FIG. 24. FIG. 24 is a front view of a cooling device when being viewed from a side of the radiators 3a, 3b. In the tenth embodiment, an example of an attachment method of the guide 19 described in the ninth embodiment is indicated in FIG. 24. In the tenth embodiment, the guide 19 is formed into L-shape, for example. One end of the guide 19 is fixed to the refrigerant tank 2 and the other end thereof is fixed to a heat-radiating tube 13b disposed at the top end of the second radiator 3b. The effect of the guide 19 is the same as that of the above-described ninth embodiment. In the tenth embodiment, the other portions are similar to those of the above-described sixth embodiment of the present invention.

An eleventh preferred embodiment of the present invention will be now described with reference to FIG. 25. FIG. 25 is a front view of a cooling device when being viewed from a side of the radiators 3a, 3b. As shown in FIG. 25, the second radiator fins 14b used for the second radiator 3b have a fin pitch P1 larger than that of the first radiator fins 14a used for the first radiator 3a. In this case, because temperature of outside fluid having passed through the second radiator core of the second radiator 3b becomes lower, low-temperature outside fluid can be supplied to the first radiator 3a. In the eleventh embodiment, the other portions are similar to those of the above-described sixth embodiment of the present invention.

Figure 26:
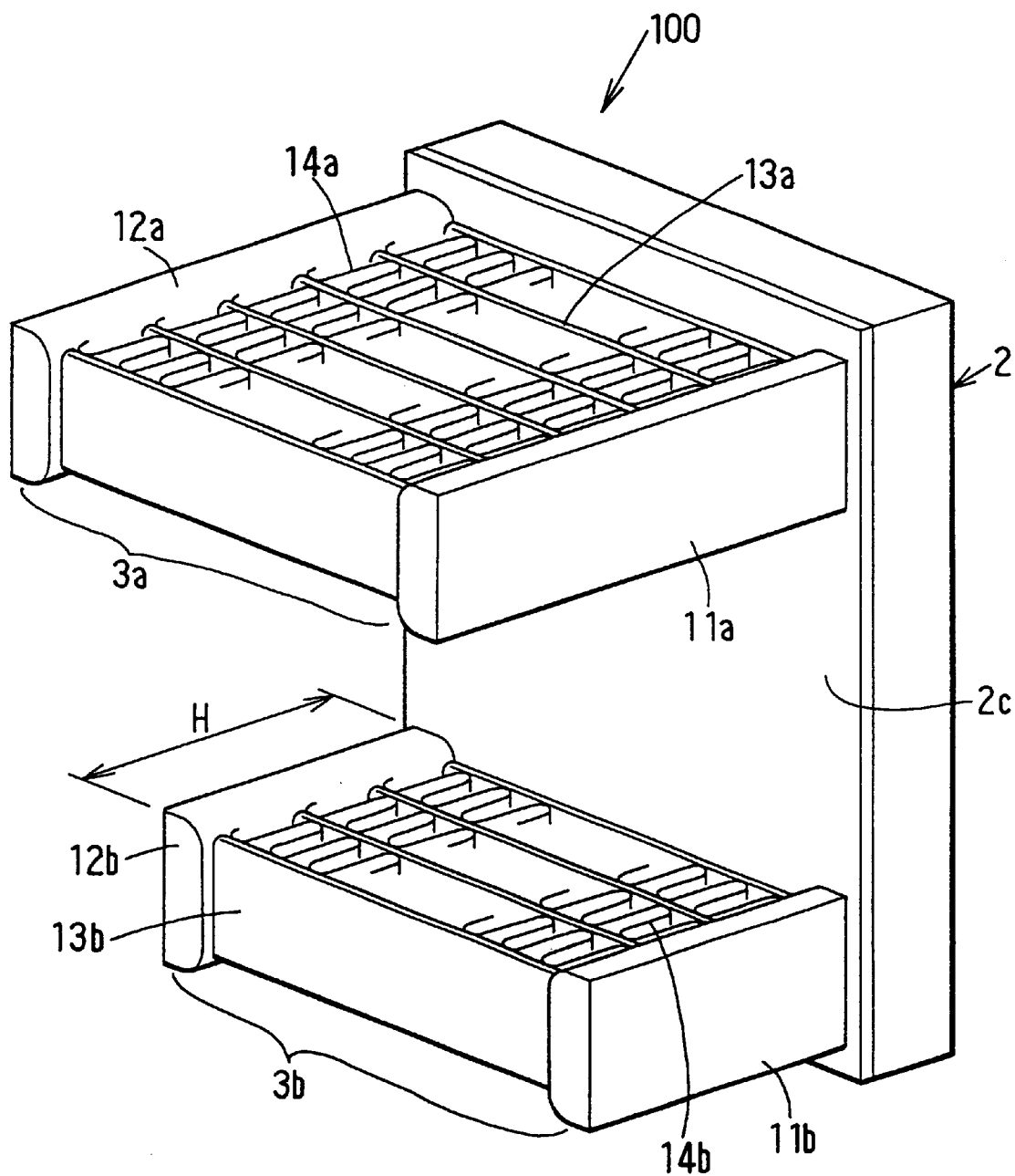
FIG. 26 is a perspective view of a cooling device according to a twelfth preferred embodiment of the present invention.

A twelfth preferred embodiment of the present invention will be now described with reference to FIG. 26. FIG. 26 is a perspective view of a cooling device 100. As shown in FIG. 26, in the twelfth embodiment, a dimension H (i.e., second radiator height relative to the other surface 2c) of the first and second headers 11b, 12b in the longitudinal direction of the first and second headers 11b, 12b of the second radiator 3b is set lower than that of the first radiator 3a. In this case, a clearance between the most top second radiator tube 13b and an inner surface of the duct 15, in the longitudinal direction of the first and second headers 11b, 12b, becomes larger. Therefore, low-temperature outside fluid can be directly supplied to the first radiator 3a through this clearance. In the twelfth embodiment, the other portions are similar to those of the above-described sixth embodiment.

Figure 27:
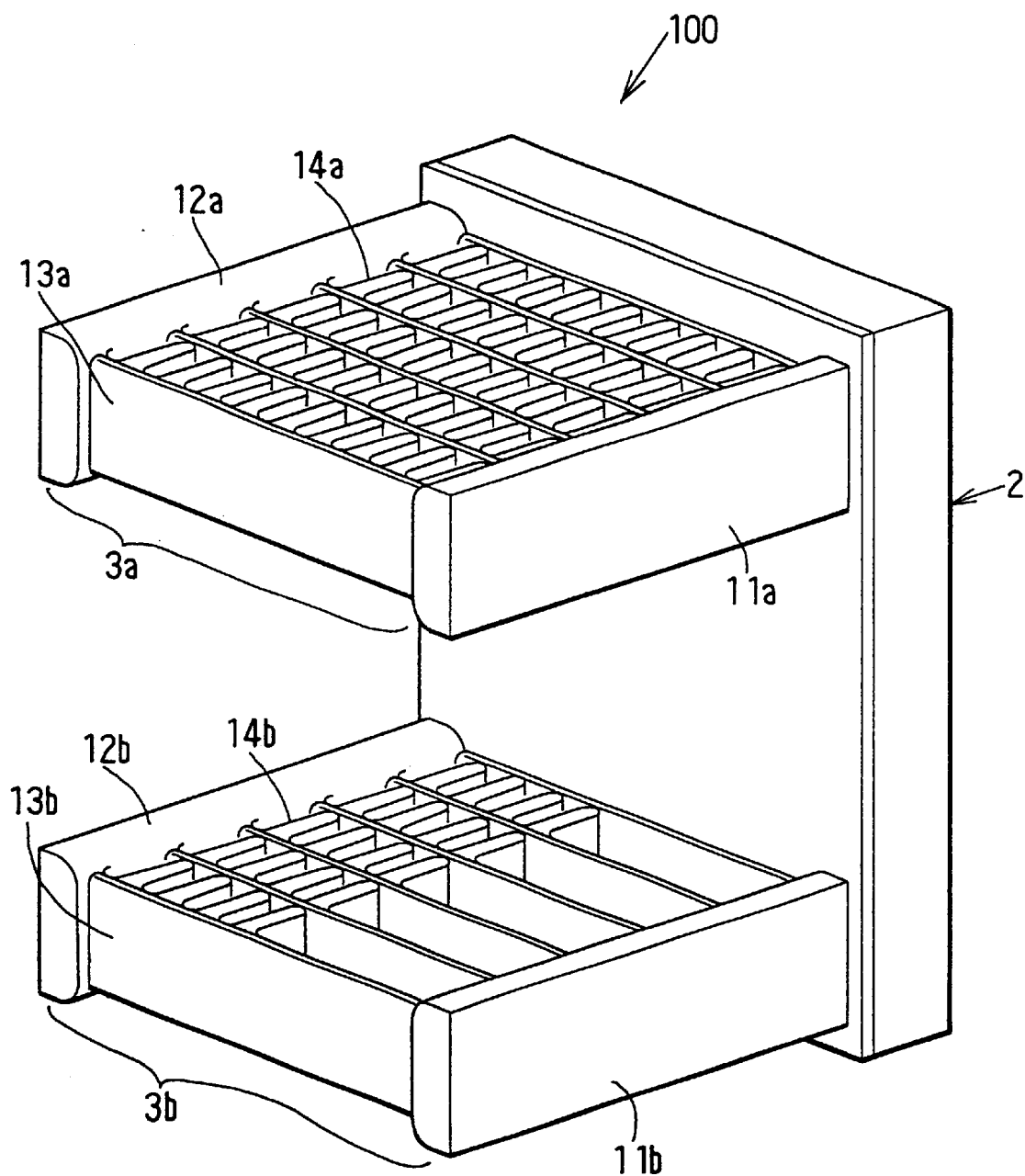
FIG. 27 is a perspective view of a cooling device according to a thirteenth preferred embodiment of the present invention.

A thirteenth preferred embodiment of the present invention will be now described with reference to FIG. 27. FIG. 27 is a perspective of a cooling device according to the thirteenth embodiment. In the thirteenth embodiment, as shown in FIG. 27, each length of the second radiator fins 14b in the longitudinal direction of the second tubes 13b is made shorter than that of the first radiator fins 14a. That is, in the second radiator 3b, the second radiator fins 14b are not provided at a part of positions between the adjacent second radiator tubes 13b.

In the second radiator 3b, condensed liquid refrigerant flows from the second header 12b toward the first header 11b, the heat-exchange contributing percentage of the second radiator fins 14b on a side of the first header 11b becomes smaller. In the thirteenth embodiment, because the second radiator fins 14b are made shorter so that the second radiator fins 14b are separated from the first header 11b of the second radiator 3b, the temperature of outside fluid having passed through the second radiator 3b can be lowered. Accordingly, low-temperature outside fluid can be supplied to the first radiator 3a. In the thirteenth embodiment, the other portions are similar to those of the above-described sixth embodiment.

Figure 28:
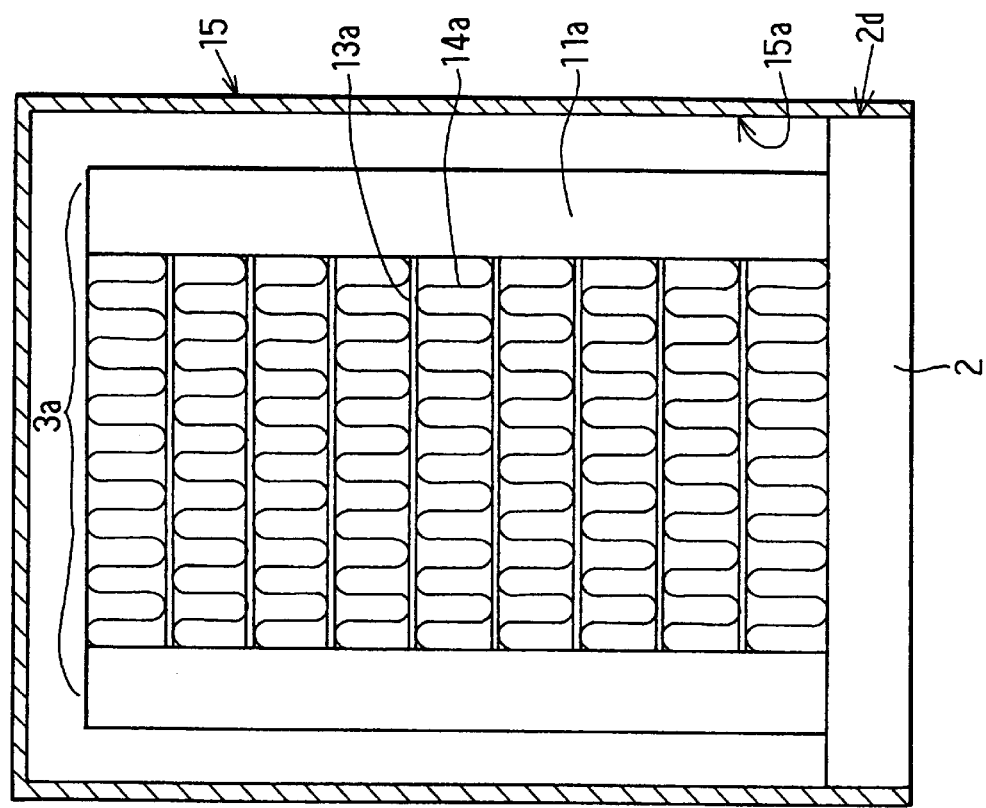
FIG. 28 is a front view of a cooling device when being viewed from a radiator side according to a fourteenth preferred embodiment of the present invention.

A fourteenth preferred embodiment of the present invention will be now described with reference to FIG. 28. FIG. 28 is a front view of a cooling device when being viewed from a side of the radiators 3a, 3b. As shown in FIG. 28, in the fourteenth embodiment, the outer peripheral surfaces of each header 11b, 12b of the second radiator 3b are formed to be smoothly curved. Therefore, outside fluid readily passes through the first clearance S1, and the amount of low-temperature outside fluid introduced into the first radiator 3a while bypassing the second radiator 3b can be increased. In the fourteenth embodiment, because the outer peripheral surfaces of each header 11a, 12a of the first radiator 3b are also formed to be smoothly curved, the cooling device 100 can be used reversely in the up-down direction. In the fourteenth embodiment, the other portions are similar to those of the above-described sixth embodiment.

Figure 29:
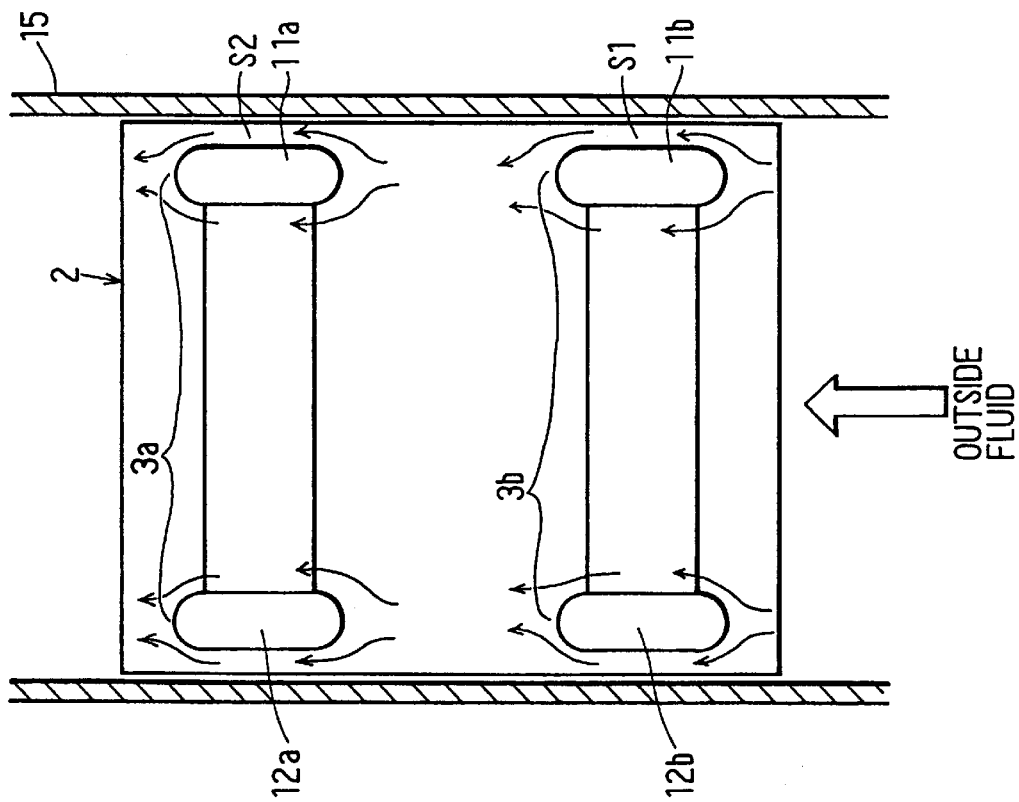
FIG. 29 is a top view of a cooling device when being viewed from an upper side of the cooling device according to a fifteenth preferred embodiment of the present invention.

A fifteenth preferred embodiment of the present invention will be now described with reference to FIG. 29. FIG. 29 is a plan view of a cooling device when being viewed from an upper side of the cooling device 1. In the fifteenth embodiment, an attachment position of the duct 15 is set by both side surfaces 2d of the refrigerant tank 2. Specifically, as shown in FIG. 29, the inner side surfaces 15a of the duct 15 contacts both the side surfaces 2d of the refrigerant tank 2. Therefore, the duct 15 is readily accurately assembled. Further, because the first clearance S1 and the second clearance S2 described in the above-described sixth embodiment are also provided, a shock affected from an outside of the duct 15 to the duct 15 can be absorbed by the first and second clearances S1, S2. Accordingly, it can prevent the shock from being transmitted to the first and second radiators 3a, 3b. In the fifteenth embodiment, the other portions are similar to those of the above-described sixth embodiment.

Figure 30:
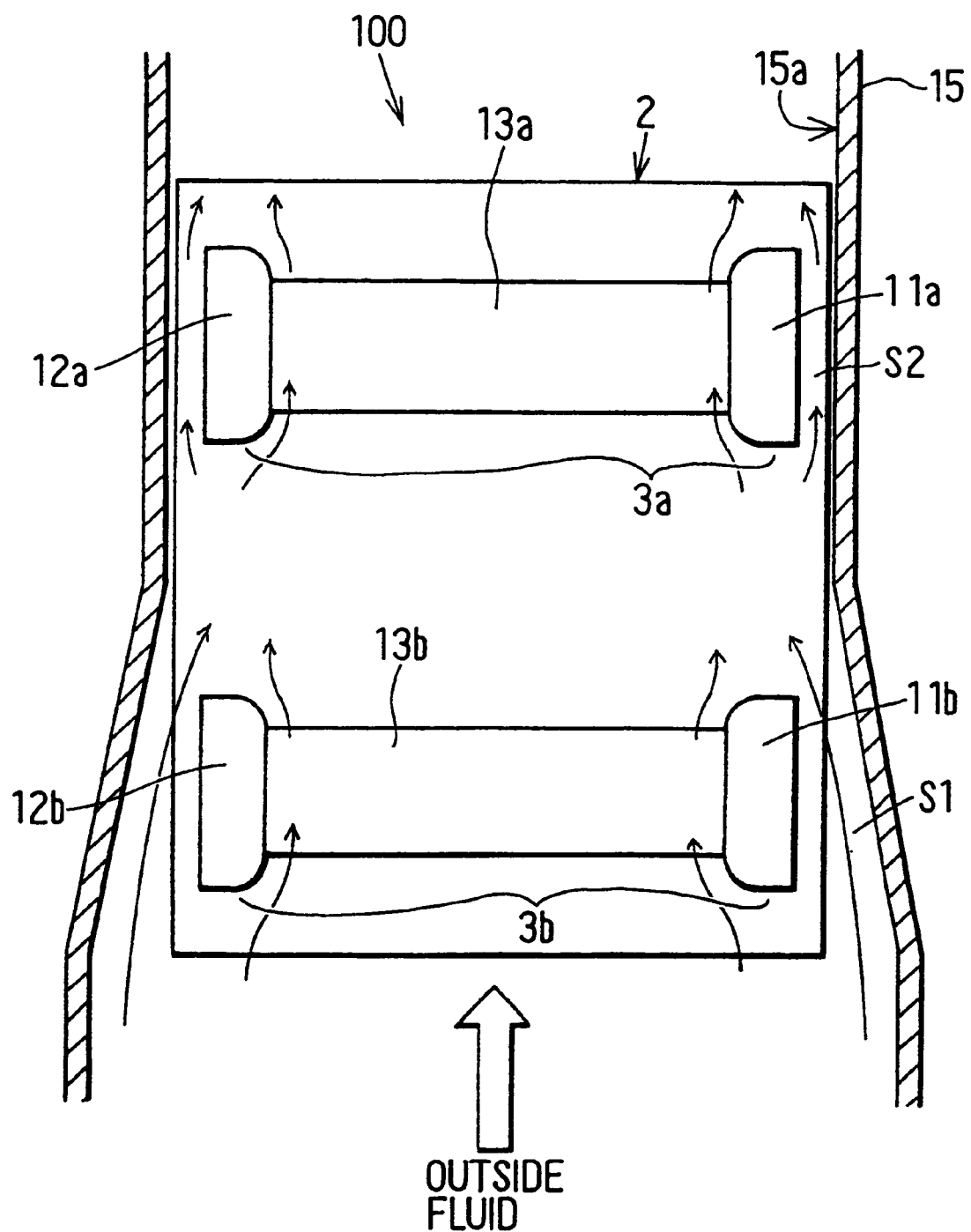
FIG. 30 is a front view of a cooling device when being viewed from a radiator side according to a sixteenth preferred embodiment of the present invention.

A sixteenth preferred embodiment of the present invention will be now described with reference to FIG. 30. FIG. 30 is a front view of a cooling device when being viewed from a side of the radiators 3a, 3b. As shown in FIG. 30, a width dimension between both inner side surfaces 15a of the duct 15 is changed at both positions of the first and second radiators 3a, 3b. Specifically, as shown in FIG. 30, a duct width at the position where the second radiator 3b is disposed is set larger than a duct width at the position where the first radiator 3a is disposed. Further, the duct width at the side of the second radiator 3b is changed so that the tilt of the inner side surface 15a is gradually changed. Thus, in the sixteenth embodiment, the first clearance S1 can be made larger than the second clearance S2, and the amount of low-temperature outside fluid passing through the first clearance S1 can be increased. Even in the sixteenth embodiment, the cooling device 100 can be used reversely in the up-down direction. In the sixteenth embodiment, the other portions are similar to those of the above-described sixth embodiment.

Although the present invention has been fully described in connection with the preferred embodiments thereof with reference to the accompanying drawings, it is to be noted that various changes and modifications will become apparent to those skilled in the art.

For example, in the above-described sixth through sixteenth embodiments of the present invention, outside fluid upward passes through the second radiator 3b from below so that the second radiator 3b is disposed at an upstream side of the first radiator 3a relative to a flow direction of outside fluid. However, the present invention may be applied to a cooling device in which outside fluid passes through the first radiator 3a and the second radiator 3b downwardly from above. In this case, the first radiator 3a is positioned at an upstream side of the second radiator 3b relative to the flow direction of outside fluid.

Such changes and modifications are to be understood as being within the scope of the present invention as defined by the appended claims.

What is claimed is:

1. A cooling device boiling and condensing refrigerant, for cooling a heat-generating member, said cooling device comprising:

a refrigerant tank for defining a refrigerant chamber in which liquid refrigerant is stored and a part of liquid refrigerant is boiled and vaporized by absorbing heat from the heat-generating member through a boiling surface of said refrigerant tank, said refrigerant tank having a first wall part onto which the heat-generating member is attached, and a second wall part opposite to said first wall part; and a radiator disposed on said second wall part of said refrigerant tank to perform a heat exchange between gas refrigerant from said refrigerant tank and outside fluid passing through said radiator, wherein:

said radiator includes a first radiator portion for performing heat exchange between gas refrigerant from said refrigerant tank and outside fluid passing through said first radiator portion, and a second radiator portion for performing heat exchange between refrigerant from said first radiator portion and outside fluid passing through said second radiator portion, said second radiator portion being disposed at a lower side of said first radiator portion, the cooling device further comprising:

a duct extending in the up-down direction, for defining an outside fluid passage through which outside fluid passes through both said first radiator portion and said second radiator portion in the up-down direction, said duct being disposed to enclose both said first radiator portion and said second radiator portion, wherein:

one upstream radiator portion among said first radiator portion and said second radiator portion, disposed at an upstream side relative to a flow direction of outside fluid, is disposed to be separated from an inner surface of said duct so that a clearance is defined between said inner surface of said duct and side upstream radiator portion.

2. The cooling device according to claim 1, wherein the other downstream radiator portion among said first radiator portion and said second radiator portion, disposed at a downstream side relative to the flow direction of outside fluid, is disposed to be separated from an inner surface of said duct so that a clearance is defined between said inner surface of said duct and said downstream radiator portion.

3. The cooling device according to claim 2, further comprising
a packing detachably disposed in said clearance between said inner surface of said duct and said downstream radiator portion.

4. The cooling device according to claim 1, wherein:
said refrigerant tank has therein a plurality of refrigerant passages continuously extending in an up-down direction at least in a range of said boiling surface of said refrigerant tank; and
each passage width of said refrigerant passages is set to be equal to or smaller than double Laplace length.

5. A cooling device boiling and condensing refrigerant, for cooling a heat-generating member, said cooling device comprising:
a refrigerant tank for defining a refrigerant chamber in which liquid refrigerant is stored and a part of liquid refrigerant is boiled and vaporized by absorbing heat from the heat-generating member, said refrigerant tank having a first wall part onto which the heat-generating member is attached, and a second wall part opposite to said first wall part;
first and second radiator portions disposed on said second wall part of said refrigerant tank to perform heat exchange between gas refrigerant from said refrigerant tank and outside fluid passing through said first and second radiator portions; and
a duct extending in an up-down direction, for defining an outside fluid passage through which outside fluid passes through both said first radiator portion and said second radiator portion in the up-down direction, said duct being disposed to enclose both said first radiator portion and said second radiator portion along both outer side surfaces of said refrigerant tank, wherein:
said first radiator portion for performing heat exchange between gas refrigerant from said refrigerant tank and outside fluid passing through said first radiator portion is disposed at an upper side of said second radiator portion for performing heat exchange between refrigerant from said first radiator and outside fluid passing through said second radiator portion; and
one upstream radiator portion among said first radiator portion and said second radiator portion, disposed at an upstream side relative to a flow direction of outside fluid, is disposed to be separated from an inner surface of said duct so that a first clearance through which outside fluid bypasses said upstream radiator portion is defined between said inner surface of said duct and said upstream radiator portion.

6. The cooling device according to claim 5, wherein the other downstream radiator portion among said first radiator portion and said second radiator portion, disposed at a downstream side relative to the flow direction of outside fluid, is disposed to be separated from said inner surface of said duct so that a second clearance through which outside fluid bypasses said downstream radiator portion is defined between said inner surface of said duct and said downstream radiator portion.

7. The cooling device according to claim 6, further comprising
a packing detachably disposed in said second clearance.

8. The cooling device according to claim 6, wherein said first clearance has a sectional flow area larger than that of said second clearance.

9. The cooling device according to claim 5, further comprising
communication passage means for defining a communication passage through which said first radiator portion and said second radiator portion communicate with each other, wherein:
said first radiator portion includes a first header into which gas refrigerant from said refrigerant chamber flows, a plurality of first tubes in which gas refrigerant from said first header is cooled and condensed by performing heat exchange with outside fluid passing through said first radiator, and a second header from which liquid refrigerant condensed in said first tubes is introduced into said communication passage;
said second radiator includes a first header into which refrigerant from said communication passage flows, a plurality of second tubes in which refrigerant from said first header of said second radiator is further cooled and condensed by performing heat exchange with outside fluid passing through said second radiator, and a second header through which liquid refrigerant from said second tubes is introduced into said refrigerant chamber; and
said first clearance is provided between at least one outer side surface of said first and second headers of said upstream radiator portion and an inner side surface of said duct.

10. The cooling device according to claim 9, wherein a width dimension between said first and second headers of said upstream radiator portion is set shorter than a width dimension between said first and second headers of said downstream radiator portion.

11. The cooling device according to claim 9, wherein:
said upstream radiator portion has plural fins between adjacent said first tubes or said second tubes; and
said plural fins of said upstream radiator portion has a fin pitch larger than that of said downstream radiator portion.

12. The cooling device according to claim 9, wherein said upstream radiator portion has a header dimension of said first and second headers in a header longitudinal direction, which is smaller than that of said downstream radiator portion.

13. The cooling device according to claim 9, wherein each of said first and second headers of said upstream radiator portion has a smoothly curved outer peripheral surface.

14. The cooling device according to claim 5, wherein said duct has an enlarged width dimension at a position where said upstream radiator portion is disposed.

15. The cooling device according to claim 5, further comprising
a guide for introducing outside fluid having passed through said first clearance into the other downstream radiator portion which is disposed at a downstream side of said upstream radiator portion among said first and second radiator portions.

* * * * *